US008957729B2

(12) United States Patent
Bai

(10) Patent No.: US 8,957,729 B2
(45) Date of Patent: Feb. 17, 2015

(54) MEMORY STRUCTURE HAVING TAPS AND NON-UNITARY DELAYS BETWEEN TAPS

(75) Inventor: Chunlong Bai, Kanata (CA)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 199 days.

(21) Appl. No.: 13/495,816

(22) Filed: Jun. 13, 2012

(65) Prior Publication Data

US 2013/0249631 A1 Sep. 26, 2013

Related U.S. Application Data

(60) Provisional application No. 61/613,218, filed on Mar. 20, 2012.

(51) Int. Cl.
*H03F 1/26* (2006.01)
*H04K 1/02* (2006.01)
*H04B 1/04* (2006.01)

(52) U.S. Cl.
USPC ............................................ 330/149; 330/296

(58) Field of Classification Search
USPC ................. 330/149, 296; 375/296; 455/114.3
IPC .................. H03F 1/26; H04K 1/02; H04B 1/04
See application file for complete search history.

(56) References Cited

U.S. PATENT DOCUMENTS

| 5,828,701 | A | * | 10/1998 | Henriksson | 375/233 |
|---|---|---|---|---|---|
| 6,798,843 | B1 | * | 9/2004 | Wright et al. | 375/296 |
| 7,035,361 | B2 | * | 4/2006 | Kim et al. | 375/350 |
| 7,577,211 | B2 | * | 8/2009 | Braithwaite | 375/296 |
| 7,804,760 | B2 | * | 9/2010 | Schmukler et al. | 370/201 |
| 8,356,063 | B2 | * | 1/2013 | Abe et al. | 708/316 |
| 2005/0163268 | A1 | * | 7/2005 | McCallister | 375/346 |
| 2010/0215125 | A1 | * | 8/2010 | Furman | 375/319 |
| 2012/0119832 | A1 | * | 5/2012 | Bai et al. | 330/149 |

OTHER PUBLICATIONS

Mkadem et al. "Physically Inspired Neural Network Model for RF Power Amplifier Behavioral Modeling and Digital Predistortion" EmRG Research Group, Dep. of Electrical and Computer Engineering, Universit of Waterloo, ON N2L-3G1 Canada. Manuscript received Jul. 2, 2010 and revised Oct. 2010. consisting of 12-pages.

* cited by examiner

Primary Examiner — Patricia Nguyen
(74) Attorney, Agent, or Firm — Christopher & Weisberg, P.A.

(57) ABSTRACT

A method and apparatus for memory modeling in a predistortion architecture are disclosed. In one embodiment, a memory model has a plurality of branches. Each branch receives a different output basis function signal. Each branch includes at least one delay element. Each delay element causes a pre-determined delay of the output basis function signal received by the branch. The amount of a pre-determined delay is different for each of at least two branches.

20 Claims, 19 Drawing Sheets

Spectrum of the input signal, which is the same as the output of the 1st order power basis function
- signal bandwidth: $bw_{POWER, 1} = bw$ = 3.00 MHz
- sampling rate: $f_{sa}$ = 30.72 MHz
- largest integer smaller than (sampling rate)/(signal bandwidth): 10.

Output of the 3$^{rd}$ order power basis function
- signal bandwidth:   $bw_{POWER, 3} = 3bw$   =   9.00 MHz
- sampling rate:   $f_{sa}$   =   30.72 MHz
- largest integer smaller than (sampling rate)/(signal bandwidth): 3.

Output of the 5th order power basis function
- signal bandwidth: $bw_{POWER, 5} = 5bw = 15.00$ MHz
- sampling rate: $f_{sa} = 30.72$ MHz
- largest integer smaller than (sampling rate)/(signal bandwidth): 2.

MEMORY STRUCTURE HAVING TAPS AND NON-UNITARY DELAYS BETWEEN TAPS

CROSS-REFERENCE TO RELATED APPLICATION

This application is related to and claims priority to U.S. Provisional Patent Application Ser. No. 61/613,218, filed Mar. 20, 2012, entitled MEMORY STRUCTURE HAVING TAPS AND NON-UNITARY DELAYS BETWEEN TAPS, the entirety of which is incorporated herein by reference.

TECHNICAL FIELD

The present invention relates to modeling non-linear electronic devices and, more particularly, to methods and apparatus for pre-distorting a signal to compensate for distortion subsequently introduced to the signal by a non-linear electronic device.

BACKGROUND

The design of radio-frequency power amplifiers for communications applications often involves a trade-off between linearity and efficiency. Power amplifiers are typically most efficient when operated at or near the saturation point. However, the response of the amplifier at or near the point of saturation is non-linear. Generally speaking, when operating in the high-efficiency range, a power amplifier's response exhibits a nonlinear response and memory effects.

One way to improve a power amplifier's efficiency and its overall linearity is to digitally pre-distort the input to the power amplifier to compensate for the distortion introduced by the power amplifier. In effect, the input signal is adjusted in anticipation of the distortion to be introduced by the power amplifier, so that the output signal is largely free of distortion products. Generally, digital pre-distortion is applied to the signal at baseband frequencies, i.e., before the signal is up-converted to radio frequencies.

These techniques can be quite beneficial in improving the overall performance of a transmitter system, in terms of both linearity and efficiency. Furthermore, these techniques can be relatively inexpensive, due to the digital implementation of the pre-distorter. In fact, with the availability of these techniques, power amplifiers may be designed in view of more relaxed linearity requirements than would otherwise be permissible, thus potentially reducing the costs of the overall system.

A problem encountered in pre-distortion architectures is the memory effect phenomenon in which a current output of a power amplifier is a result of previous inputs. This memory effect arises due to the physical interactions of the components of the power amplifier as well as temperature variations. The previous inputs that affect a current output of the power amplifier may have been received in past picoseconds, nanoseconds, microseconds, milliseconds, or even seconds. Thus, a wide range of memory effects should be modeled by the pre-distorter.

Conventionally, a pre-distorter is modeled by a memoryless part and a memory part. The memoryless part may include several branches, each branch applying a different basis function or operation to the input signal to be pre-distorted. The memory part has a branch for each branch of the memoryless part. Each branch of the memory part typically has a structure that includes delay elements, taps and weights to produce a distortion component, $d_k$. The outputs of the branches of the memory part are summed to produce the distortion signal, d. Each of the branches of the memory part have the same structure. This leads to inefficiency and wasted computations, since different basis functions have different memory requirements. This also leads to instability.

Therefore, what is needed is a memory structure that has different configurations for each branch to accommodate memory requirements for different basis functions to allow accurate pre-distortion modeling.

SUMMARY

The present invention advantageously provides a method and system for modeling pre-distortion in an electronic circuit. According to one aspect, the invention provides a pre-distorter memory modeling apparatus that includes a plurality of branches. Each branch receives a different output basis function signal. Each branch includes at least one delay element having a corresponding output. Each delay element of a branch causes a pre-determined delay of the output basis function received by the branch. The amount of pre-determined delay is different for each of at least two branches. The pre-determined delay may be based at least in part on a characteristic of the output basis function signal received by the branch, such as a ratio of a sampling frequency to a bandwidth of the output basis function signal received by the branch. In some embodiments, a branch may include at least one statistical evaluation block receiving an output of at least one delay element.

According to another aspect, the invention provides a method of generating a distortion signal, d(n). A received input signal x(n) is supplied to each of K branches, where K is an integer not less than 1. The input signal x(n) is operated on by a different basis function in each branch to produce K output signals, $u_k(n)$, where k denotes the kth branch. The K output signals $u_k(n)$ are applied to a different ones of K memory models. Each memory model has at least one delay element that delays the signal $u_k(n)$ by a pre-determined delay that is different for each of at least two branches. The output of each of the at least one delay element is multiplied by a coefficient, and the outputs of the multipliers are added to produce a distortion signal component $d_k(n)$ of the branch. The distortion signal components $d_k(n)$ from the various branches are added to produce the distortion signal d(n).

According to another aspect, the invention provides a pre-distorter memory model branch. The pre-distorter memory model branch has a plurality of sequential delay elements to delay a received signal $u_k(n)$ by a pre-determined amount of delay in each delay element. The pre-distorter memory model includes a least one statistical evaluation block that receives a plurality of outputs from a plurality of the delay elements, applies a weight to at least one of the plurality of outputs to produce at least one weighted signal, and combines the at least one weighted signal to produce an output $d_k$.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
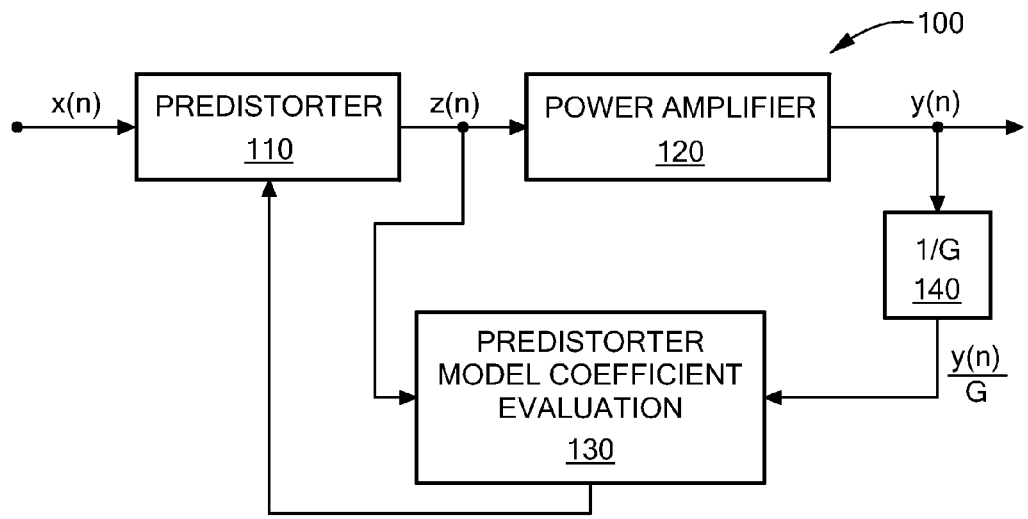
FIG. 1 is a block diagram of an exemplary indirect-learning architecture for a pre-distortion circuit constructed in accordance with principles of the present invention.

Before describing in detail exemplary embodiments that are in accordance with the present invention, it is noted that the embodiments reside primarily in combinations of apparatus components and processing steps related to compensating for distortion in a non-linear electronic device. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Referring now to the drawing figures, in which like reference designators denote like elements, there is shown in FIG. 1, an exemplary pre-distortion system 100 constructed in accordance with principles of the present invention that is configured to compensate for distortion introduced to a communication signal by a power amplifier 120. As noted above, a power amplifier is typically most efficient when it is operated in a non-linear range. However, the non-linear response of a power amplifier causes unwanted out-of-band emissions and reduces spectral efficiency in a communication system. In the system 100 of FIG. 1, a pre-distorter 110 is used to improve the power amplifier's efficiency and linearity by "pre-distorting" the power amplifier's input signal to compensate for the non-linear distortion introduced by the power amplifier 120. The cascading of the pre-distorter 110 and power amplifier 120 improves the linearity of the output signal, even while power amplifier 120 is operated at high efficiency.

Although pre-distortion is used in the circuits and systems described herein to linearize the output of a power amplifier 120, those skilled in the art will appreciate that the techniques described herein are applicable to characterizing and/or compensating for distortion caused by any type of non-linear electronic device.

As seen in the pre-distortion system 100 of FIG. 1, an input signal x(n) is input to the pre-distorter 110. The pre-distorter 110 pre-distorts the input signal x(n) to compensate for the distortion introduced by the power amplifier 120 when the power amplifier 120 is operated in its non-linear range. The pre-distorted input signal z(n) generated by the pre-distorter 110 is then applied to the input of the power amplifier 120, which amplifies the pre-distorted input signal z(n) to produce an output signal y(n). If the pre-distorter 110 is properly designed and configured, then the output signal y(n) contains fewer distortion products and out-of-band emissions than if the power amplifier 120 were used alone.

To compensate for the distortion introduced by the power amplifier 120, the pre-distorter 110 must have a non-linear transfer function that effectively reverses the non-linear effects of the power amplifier 120. To properly configure the pre-distorter 110, an appropriate model for this non-linear transfer function is created. Two different approaches to deriving this non-linear transfer function are possible. The first approach utilizes an indirect-learning architecture, as depicted in FIG. 1. The second uses the direct-learning architecture of FIG. 2.

In both cases, the signal z(n) input to power amplifier 120 and a scaled version of the power amplifier output signal y(n) is applied to a distortion modeling circuit. In the indirect-learning architecture of FIG. 1, this distortion modeling circuit includes a pre-distorter model coefficient evaluation block 130. In the direct-learning architecture of FIG. 2, the distortion modeling circuit has two functional blocks: a power amplifier model coefficient evaluation block 210 and a pre-distorter model coefficient derivation block 220. Note that as used herein, a model refers to the hardware, or combination of hardware and software used to implement pre-distortion in an input signal, or to model such pre-distortion.

Figure 2:
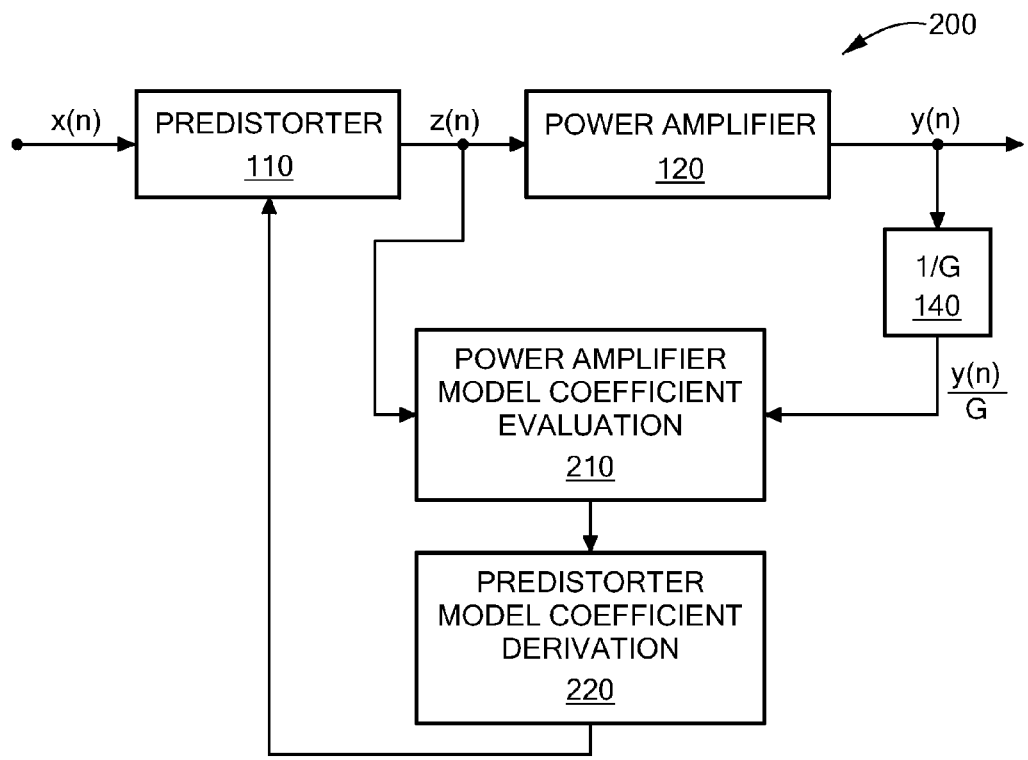
FIG. 2 is a block diagram of an exemplary direct-learning architecture for a pre-distortion circuit constructed in accordance with principles of the present invention.

In either case, the scaling of the power amplifier signal, illustrated as the attenuator 140 in FIGS. 1 and 2, reflects the net linear gain G that is desired from the combination of the pre-distorter 110 and the power amplifier 120. Scaling the output signal y(n) by the inverse of G permits the non-linearities introduced by the power amplifier 120 to be analyzed independently from its gain.

In the indirect-learning architecture of FIG. 1, a general structure for a model of the pre-distorter 110 is assumed, and the pre-distorter model's coefficients (parameters) are estimated directly from the input and outputs of the power amplifier 120. Thus, the pre-distorter modeling circuit 130 evaluates the amplifier input signal z(n) and the scaled amplifier output signal y(n)/G according to a predetermined non-linear model for the pre-distorter 110 to directly determine a set of weighting coefficients to be applied by the pre-distorter 110. In this indirect approach, a model for the power amplifier 120 is not derived. Rather, the non-linear characteristics of the power amplifier 120 are learned indirectly, through the modeling of the pre-distortion needed to counteract the distortion introduced by the power amplifier 120.

In contrast, the direct-learning architecture of FIG. 2 directly characterizes the non-linear performance of the power amplifier 120. First, the power amplifier modeling circuit 210 evaluates the amplifier input signal z(n) and the amplifier output signal y(n)/G according to a predetermined non-linear model for the power amplifier 120. The weighting coefficients that best fit the power amplifier's non-linear characteristics to the power amplifier model in block 120 are then used by coefficient derivation circuit 220 to generate weights for configuring the pre-distorter 110.

In the direct-learning architecture, the distortion introduced by the power amplifier 120 is typically represented by a complicated non-linear function, which will be referred to herein as the distortion function. In the indirect-learning architecture, the response of the pre-distorter 110 is represented by a similar non-linear distortion function. In either case, one approach to modeling the distortion function, referred to herein as the decomposition approach, is to decompose the distortion function into a set of less complicated basis functions, each of which separately acts on the input signal. The output of the distortion function is then modeled as the weighted sum of the basis function outputs. The set of basis functions used to model the distortion function is referred to herein as the basis function set.

Figure 3:
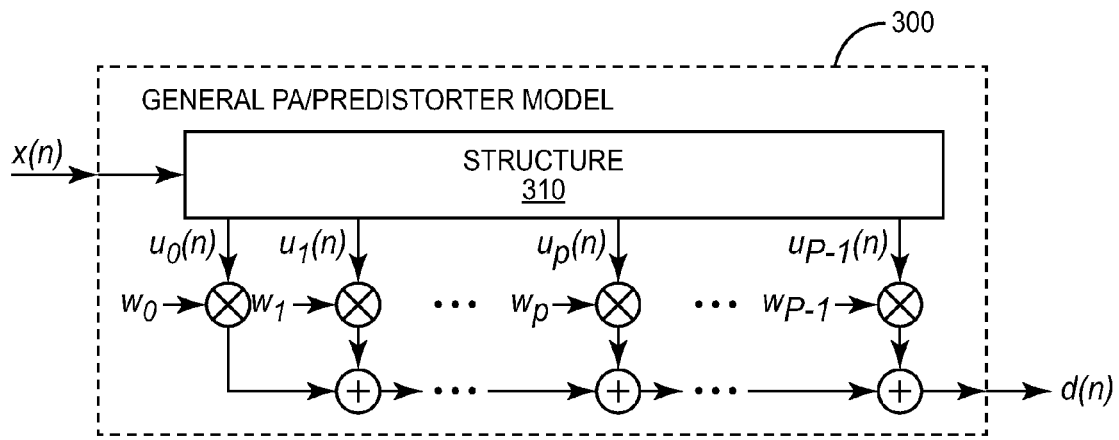
FIG. 3 is a block diagram of an exemplary generic distortion model for modeling distortion introduced by a predistorter or power amplifier constructed in accordance with principles of the present invention.

FIG. 3 illustrates a generalized multi-branch distortion model 300, which may represent the distortion introduced by the power amplifier 120 e.g., as modeled by model coefficient evaluation unit 210 in the direct learning architecture of FIG. 2 or the pre-distortion transfer function of the pre-distorter 110 e.g., as modeled by the pre-distorter model coefficient evaluation unit 130 of FIG. 1. In other words, the pre-distortion model 300 may be implemented by the pre-distorter block 110 and the coefficient evaluation unit 130 of FIG. 1 and the coefficient evaluation unit 210 of FIG. 2. In either case, the distortion model 300 has a structure 310 having P output taps, labeled $u_0(n)$ to $u'_{P-1}(n)$. Each of these output taps represents an operation on the input signal x(n), where the operations may correspond to a predetermined basis function set, as discussed in further detail below.

The model structure 310 operates on the input signal x(n) to produce data samples $\{u_0(n), u_1(n), \ldots u_{P-1}(n)\}$. The distortion model 300 then computes a weighted sum of the data samples $\{u_0(n), u_1(n), \ldots u_{P-1}(n)\}$ to obtain a distorted signal d(n). More specifically, the data samples $\{u_0(n), u_1(n), \ldots u_{P-1}(n)\}$ are multiplied by corresponding weighting coefficients $\{w_0(n), w_1(n), \ldots w_{P-1}(n)\}$, and the resulting products are added together to obtain d(n).

The distortion model shown in FIG. 3 can be represented by:

$$d(n) = \sum_{p=0}^{P-1} w_p u_p(n). \quad \text{Eq. 1}$$

Equation 1 can be written as a linear equation according to:

$$d(n) = u^T(n)w, \quad \text{Eq. 2}$$

where u(n) is a P×1 vector of data samples output by the structure at time n, and where w is a P×1 vector of the weighting coefficients.

For a given vector u(n), d(n) is the desired output of the model (e.g., the actual output of the power amplifier 120, in the direct-learning architecture, or the desired output of the pre-distorter 110, in the indirect-learning architecture). The weighting coefficients w that best fit the vector u to the desired output d(n) over a period of time can be learned by fitting multiple observations of u to the corresponding desired outputs d(n). Thus, for a set of observations taken at N sampling instances, the corresponding linear equations given by Equation 2 can be expressed as:

$$U \cdot w = d \quad \text{Eq. 3}$$

where U is an N×P matrix of data signals and d is the desired output signal vector of the distortion model. The columns of the matrix U correspond to the data samples output by the structure 130, while each row of the matrix corresponds to a different sampling instance. Equation 3 can be evaluated according to well known techniques e.g., to minimize a criterion such as a least-square-error criterion to find the weights w that best model the distortion of the power amplifier 120 or the pre-distorter 110.

Figure 4:
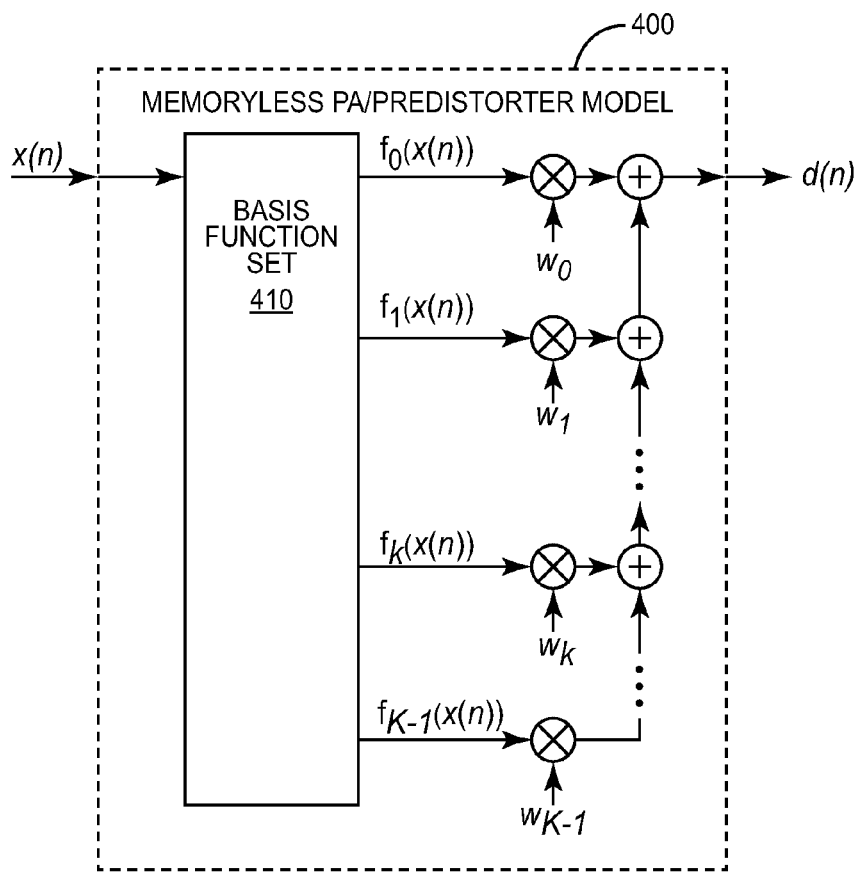
FIG. 4 is a block diagram of an exemplary memoryless distortion model for modeling distortion introduced by a predistorter or power amplifier constructed in accordance with principles of the present invention.

FIG. 4 is a block diagram of an exemplary embodiment of a memoryless, multi-branch distortion model 400 for modeling a distortion function, as may be implemented by the pre-distorter 110 and the coefficient evaluation block 130, 210. In distortion model 400, the basic structure of the model is determined by a basis function set 410 having multiple basis functions. Each of the K branches in the model corresponds to one of these basis functions, which each operates on the input signal x(n) and which are represented in FIG. 4 as $f_0(x(n))$ to $f_{K-1}(x(n))$. In this memoryless model, these functions each operate only on a present sample x(n) of the input signal, and thus are "memoryless" functions. Like the functions u(n) in the more general model illustrated in FIG. 3, each of the basis function output signals $\{f_0(x(n)), f_1((x(n)), \ldots f_{K-1}(x(n))\}$ are multiplied by corresponding weighting coefficients $\{w_0(n), w_1(n), \ldots w_{K-1}(n)\}$ and added together to obtain d(n).

A difference between the models of FIG. 3 and FIG. 4 is that the functions $f_0(x(n))$ to $f_{K-1}(x(n))$ in FIG. 4 are constrained to be memoryless. Thus, the model of FIG. 4 can be viewed as a special case of the model of FIG. 3, where each of the functions $f_0(x(n))$ to $f_{K-1}(x(n))$ corresponds to one of the functions $\{u_0(n), u_1(n), \ldots u_{P-1}(n)\}$ in FIG. 3. Accordingly, the weights w that best model the distortion of the power amplifier 120 or the pre-distorter 110 can be found in a similar manner to that described above, e.g., by fitting a matrix of N observations of the outputs of basis function set 410 to a desired output signal vector d. Of course, because the model 400 does not account for memory effects, the accuracy of this model relative to the actual distortion function of a given power amplifier may be limited.

Figure 5:
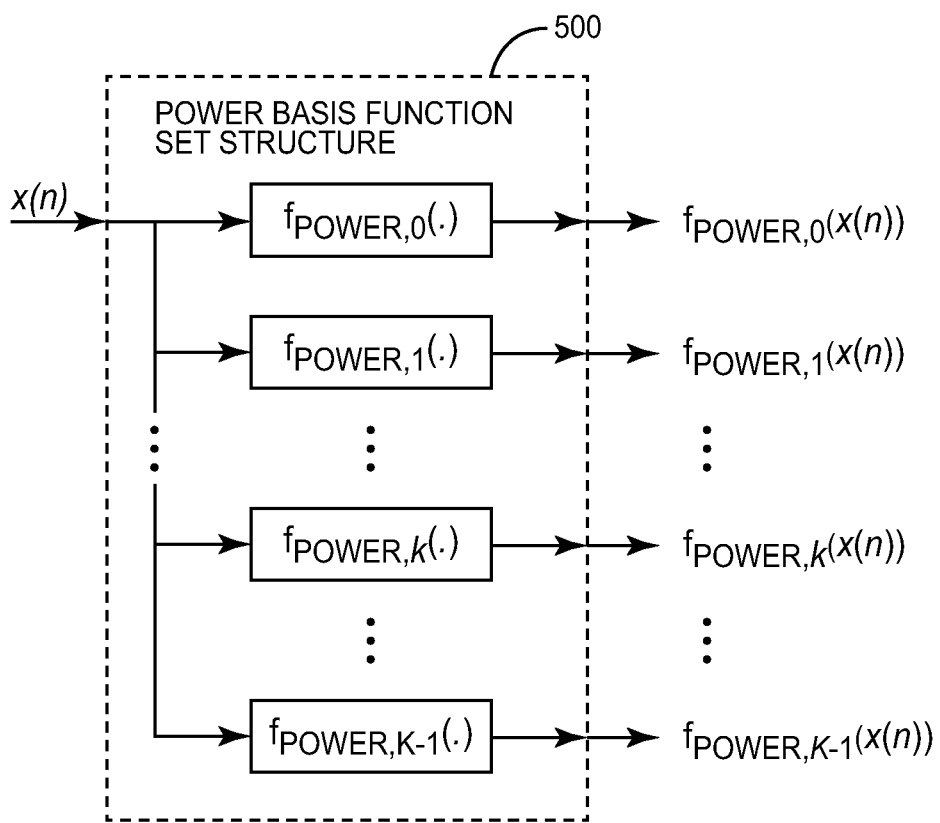
FIG. 5 is a block diagram of an exemplary basis function set structure based on the use of power functions constructed in accordance with principles of the present invention.

In some embodiments of this model, the basis function set 410 may include a set of power functions. This is illustrated in FIG. 5, where basis function set 500 has K outputs designated $f_{POWER,0}(x(n))$ to $f_{POWER,K-1}(x(n))$, where $f_{POWER,k}(x(n))=x(n)|x(n)|^k$. If the power basis function set 500 of FIG. 5 is used to model a distortion transfer function, then the basis function set 500 corresponds to the basis function set 410 of FIG. 4 and structure 310 of FIG. 3. Thus, the data samples $\{u_0(n), u_1(n), \ldots u_{P-1}(n)\}$ correspond to the outputs from the power basis functions $\{f_{POWER,0}(x(n)), f_{POWER,1}(x(n)), \ldots f_{POWER,K-1}(x(n))\}$ (where P=K). A matrix U, having N observations of the outputs of the power basis function set 500, can be formed and fitted to a desired output signal vector d to determine the weighting coefficients w that most closely model the desired distortion function.

Figure 6:
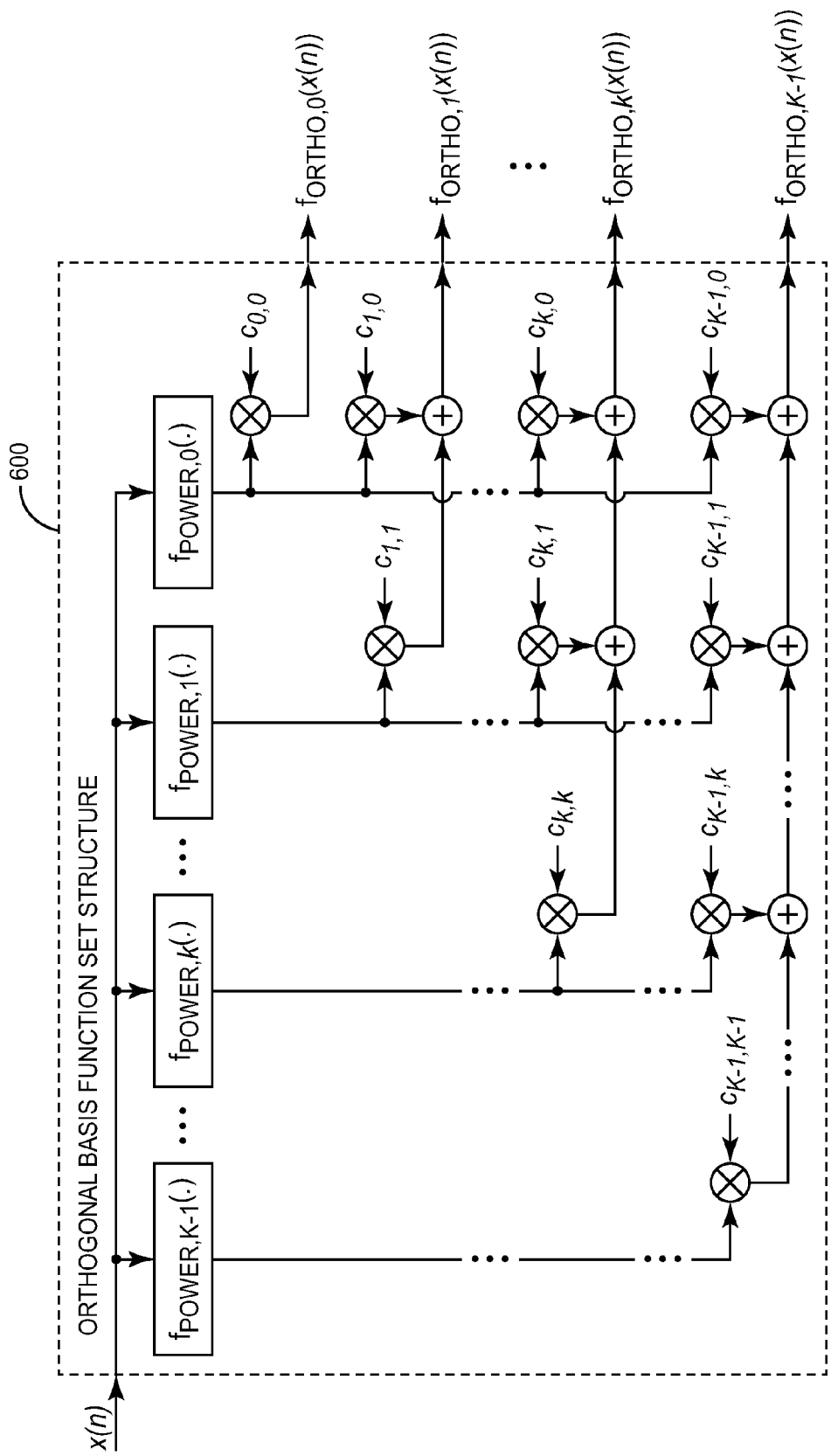
FIG. 6 is a block diagram of an exemplary orthogonal basis function set structure for modeling distortion constructed in accordance with principles of the present invention.

An orthogonal basis function set can be constructed as a weighted summation of the power basis functions. An orthogonal basis function set can be advantageous in many applications, as an orthogonal basis function set can provide better numerical stability during the matrix mathematics used to evaluate weighting coefficients for the distortion models than a non-orthogonal basis function set. FIG. 6 illustrates the basis function set structure 600 for an orthogonal basis function set, where the outputs $f_{ORTHO,0}(x(n))$ to $f_{ORTHO,K-1}(x(n))$ correspond to the output samples $\{u_0(n), u_1(n), \ldots u_{P-1}(n)\}$ of the general model 300 of FIG. 3. In this case, each data sample $u_k(n)$ can be expressed as:

$$u_k(n) = f_{ORTHO,k}(x(n)) = \sum_{h=0}^{k} c_{k,h} f_{POWER,h}(x(n)) \qquad \text{Eq. 4}$$

where the subscript, 'ORTHO,k' of the tap function $f_{ORTHO,k}(x(n))$ denotes an orthogonal basis function of the k-th order. Each connection coefficient $c_{k,h}$ is the weight for the h-th order power basis function, $f_{POWER,h}(x(n))$, used in the summations of FIG. 6 to obtain the k-th order orthogonal basis function, $f_{ORTHO,k}(x(n))$. A given ensemble of coefficients $c_{k,h}$ identifies a particular orthogonal basis function set (as given by Equation 4).

An orthogonal basis function set can be designed based on various criteria. One design that works well for several common input signal distributions is derived in Raviv Raich, Hua Qian, and G. Tong Zhou, "Orthogonal polynomials for power amplifier modeling and predistorter design," IEEE Transactions on Vehicular Technology, vol. 53, no. 5, pp. 1468-1479, September 2004.

Figure 7:
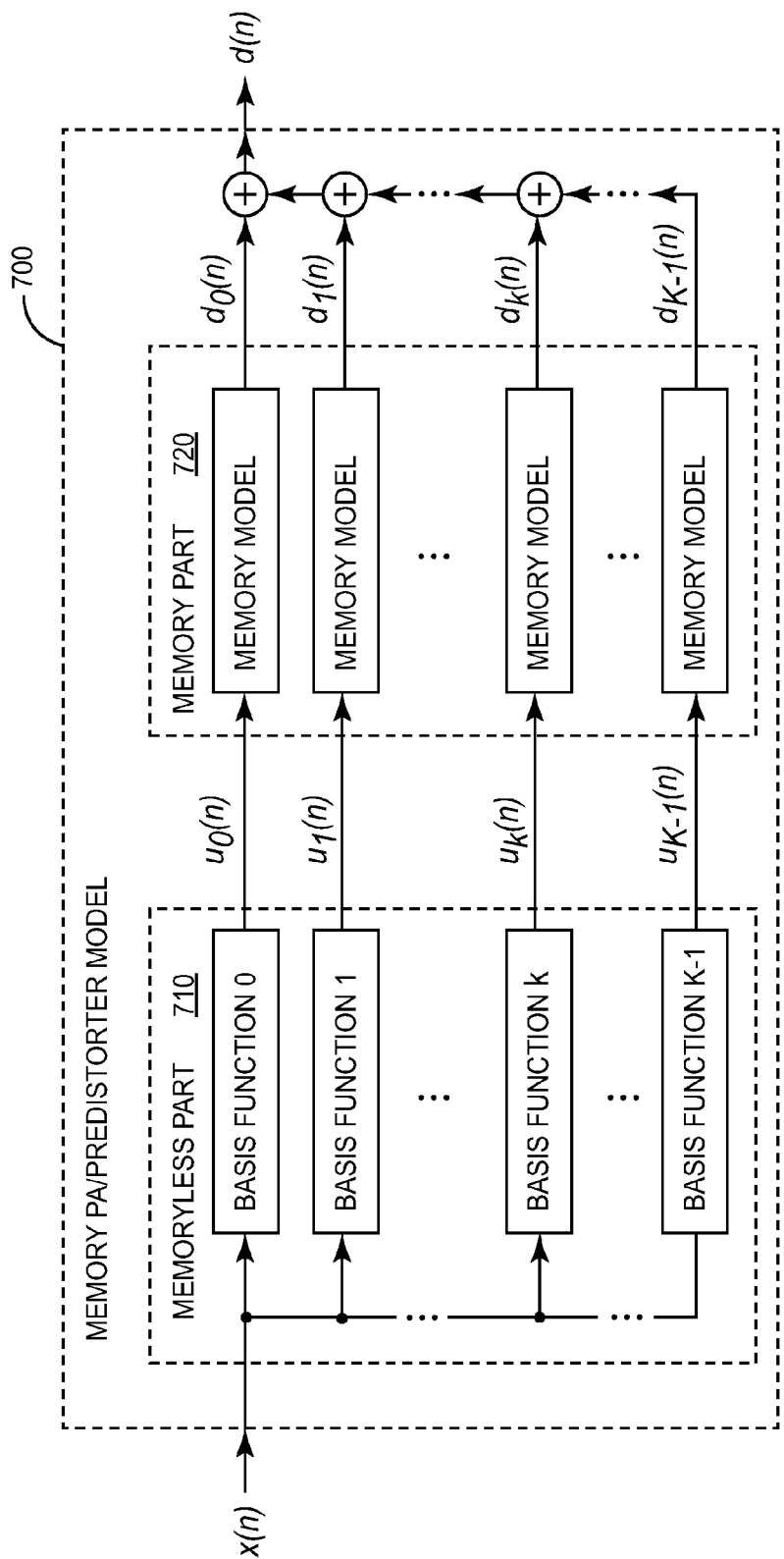
FIG. 7 is a block diagram of an exemplary pre-distortion model that includes a memoryless part and a memory part constructed in accordance with principles of the present invention.

Memory effects, i.e., the dependence of an output signal on prior states of the input signal as well as on the present state, can also be incorporated into a distortion function. FIG. 7 is a block diagram of an exemplary non-linear distortion model 700 that includes memory. In FIG. 7, the model is divided into a memoryless part 710 and a memory part 720, where the memory part 720 models memory effects corresponding to each of the K basis functions. Accordingly, the basis functions in each of the K branches in the memoryless part 710 supply basis function output signals to corresponding memory models in the memory part 720. The output from each memory model can generally be viewed as a weighted sum of the basis function output signal and/or delayed versions of the basis function output signal. For example, if the basis function for branch k is $f_k(\cdot)$ and the input signal is x(n), then the output of branch k is a weighted sum of $f_k(x(n))$, $f_k(x(n-1))$, $f_k(x(n-2))$, etc. The K outputs from the K branches are summed to form the desired distortion signal d(n).

Figure 8:
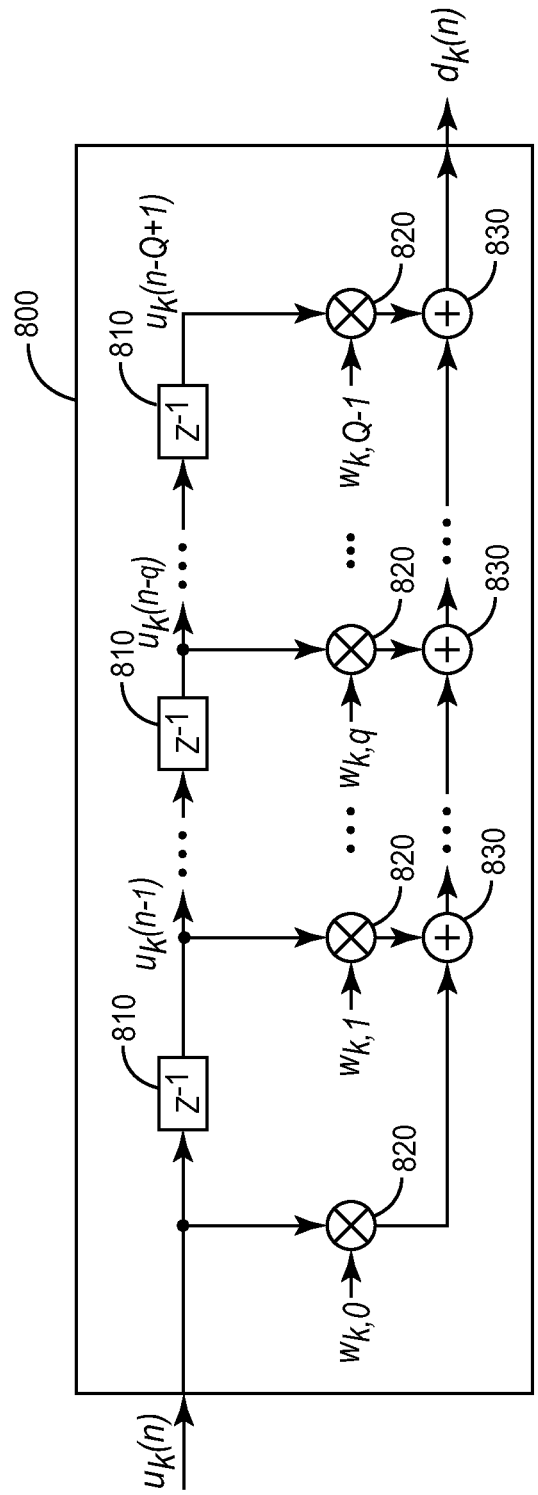
FIG. 8 is a block diagram of an exemplary memory model based on a tapped delay line with unit delays constructed in accordance with principles of the present invention.

The memory models in memory part 720 may have any of a variety of structures. One possible structure, a tapped delay line model with unit delays, is illustrated in FIG. 8. The memory model 800 corresponds to a single one of the memory models in the memory part 720 of FIG. 7. Thus, a K-branch distortion model using the tapped delay line memory model 800 of FIG. 8 would include K instances of the memory model 800.

In the tapped-delay-line memory model structure in FIG. 8, delay elements 810 (labeled with $Z^{-1}$) represent unit delays. Thus, if the input to the memory model 800 is a present sample $u_k(n)$ of the input signal, then the output of the leftmost delay element 810 is the most recent previous sample of the input signal, i.e., $u_k(n-1)$. The output of the next delay element 810 to the right is the sample prior to that one, i.e., $u_k(n-2)$. This continues through the Q-1 delay elements 810. Thus, the memory model 800 of FIG. 8 is said to have a memory depth of Q.

Each of the Q "taps" in the memory model 800, i.e., the data samples $u_k(n)$ to $u_k(n-Q+1)$, are multiplied by corresponding weights $w_{k,0}$ to $w_k, Q-1$, with multipliers 820. The resulting products are summed together, with adders 830, to form a branch output signal $d_k(n)$. Referring to FIG. 7, the branch output signals $d_k(n)$ are summed to form the desired distortion signal d(n). The structure depicted in FIG. 8 can be represented by the following equation:

$$d_k(n) = \sum_{q=0}^{Q-1} w_{k,q} u_k(n-q). \qquad \text{Eq. 5}$$

In the tapped-delay-line memory model of FIG. 8, a distinct memory function can be applied to each basis function output signal $u_k$. By configuring the weights $w_{k,q}$, any arbitrary weighted sum of the basis function output signal $u_k$ and earlier samples of the basis function output signal can be formed, up to the memory depth of Q. This allows a great deal of flexibility in modeling the memory effects of an electronic device. Q is typically chosen to ensure that that the time interval covered by Q consecutive samples is sufficient to span the most significant memory effects of the modeled distortion transfer function.

Figure 9:
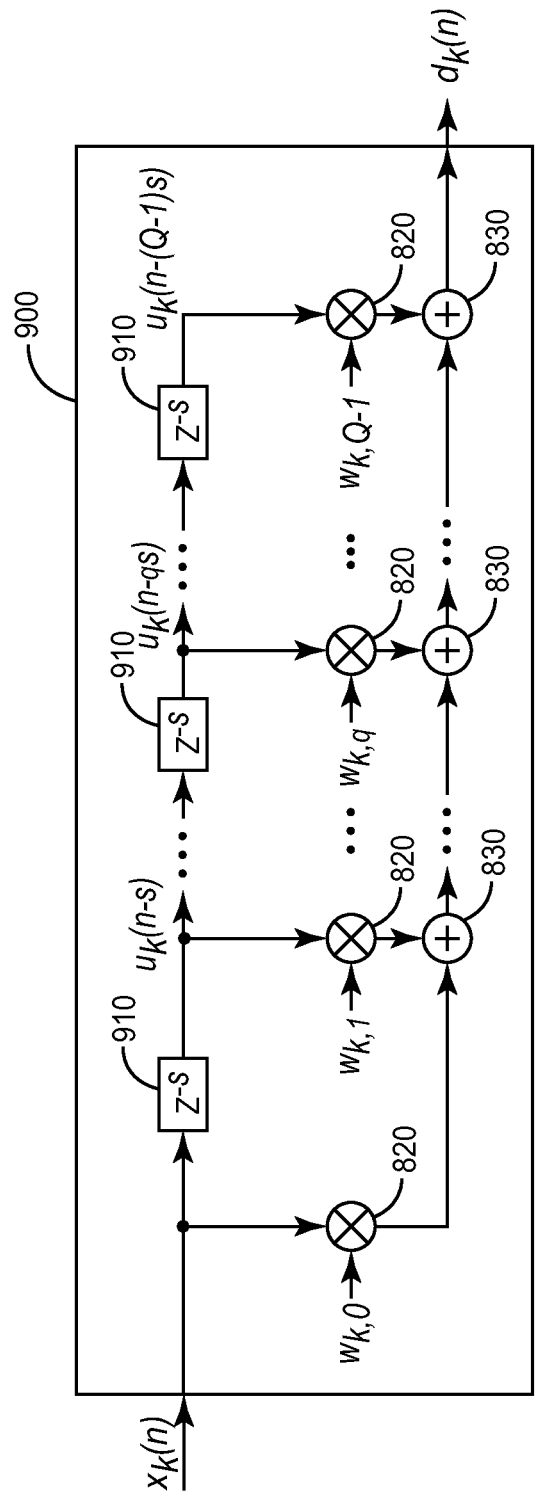
FIG. 9 is a block diagram of an exemplary memory model based on a tapped delay line with non-unit delays constructed in accordance with principles of the present invention.

Another exemplary memory model structure is shown in FIG. 9. The memory model 900 has a tapped-delay-line structure similar to the memory model 800. However, instead of the unit-delay elements 810 of FIG. 8, the memory model 900 includes several non-unit delay elements 910. These non-unit delay elements 930 are labeled $Z^{-s}$, indicating that each non-unit delay element delays its input signal by s sampling intervals, where s>1. If s=1, then the memory model 900 would be identical to the memory model 800. The structure depicted in FIG. 9 can be represented by the following equation:

$$d_k(n) = \sum_{q=0}^{Q-1} w_{k,q} u_k(n-qs) \qquad \text{Eq. 6}$$

This structure allows longer memory effects to be modeled, compared to a unit-delay tapped-delay line structure having the same number of taps. However, the resulting model will have less resolution in the time domain.

Figure 10:
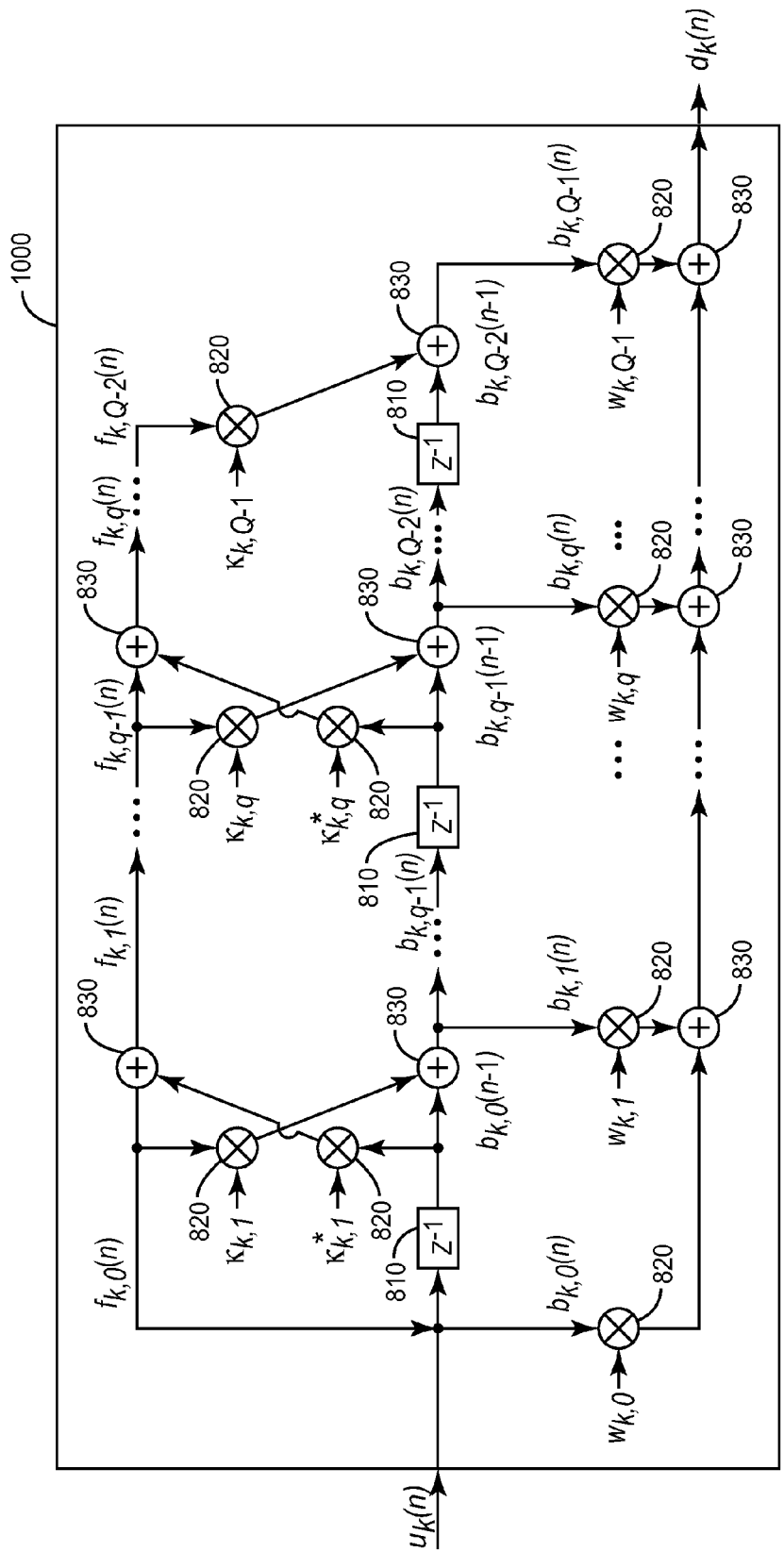
FIG. 10 is a block diagram of an exemplary memory model based on a predictive lattice with unit delays constructed in accordance with principles of the present invention.

Still another memory model structure is shown in FIG. 10, which illustrates a lattice predictor memory model 1000. In the lattice predictor memory model 1000, $f_{k,q}(n)$ and $b_{k,q}(n)$ are the q-th order forward and backward prediction errors, respectively, at time n. $\kappa_{k,q}$ is the q-th order reflection coefficient, and the superscript '*' denotes the conjugate transpose operation. It should be noted that in the predictive lattice memory model structure, the backward prediction error of a given order is delayed by one time unit, through unit-delay elements 810, before being used to evaluate the backward prediction error of the next order.

The structure depicted in FIG. 10 can be represented by the following algorithm:

1. q=0 (initialization):

$$f_{k,0}(n) = b_{k,0}(n) = u_k(n) \qquad \text{Eq. 7}$$

2. q=1, ... Q−2 (first stage to the second-to-last stage):

$$f_{k,q}(n) = f_{k,q-1}(n) + \kappa^*_{k,q} b_{k,q-1}(n-1) \qquad \text{Eq. 8}$$

$$b_{k,q}(n) = \kappa_{k,q} f_{k,q-1}(n) + b_{k,q-1}(n-1) \qquad \text{Eq. 9}$$

3. q−Q−1 (the last stage; $f_{k,Q-1}(n)$ does not need to be computed):

$$b_{k,Q-1}(n) = \kappa_{k,Q-1} f_{k,Q-2}(n) + b_{k,Q-2}(n-1) \qquad \text{Eq. 10}$$

An estimate $\hat{\kappa}_{k,q}$ of the q-th order reflection coefficient can be evaluated based on a typical set of data of length N using the Burg estimate as:

$$\hat{\kappa}_{k,q} = \frac{2 \sum_{n=m+1}^{N} b_{k,q-1}(n-1) f^*_{k,q-1}(n)}{\sum_{n=m+1}^{N} [|f_{k,q-1}(n)|^2 + |b_{k,q-1}(n-1)|^2]} \qquad \text{Eq. 11}$$

Note that in Equation 11, the start value of both summations are set to n=m+1 to exclude zero terms, based on the assumption that $u_k(n)=0$ for n<0.

Each of the distortion models in FIG. 3-7 includes a set of taps, or data samples, that are weighted and summed to form the "desired" distortion signal d(n), as follows:

$$\underset{1 \times P}{u^T(n)} \cdot \underset{P \times 1}{w} = d(n) \qquad \text{Eq. 12}$$

This is true whether or not the model includes memory. In a memoryless model, the elements of $u^T$ consist only of the basis function output signals, i.e., each element is strictly a function of x(n). In a model with memory, $u^T$ also includes elements corresponding to delayed versions of the basis function output signals. Thus, some elements of $u^T$ may correspond to a function of x(n−1), x(n−2), etc. Note that in Equation 12 and as generally used herein, $(\cdot)^T$ denotes a transpose, $(\cdot)^H$ denotes a conjugate transpose, P is the number of coefficients in the model, the P×1 vector u(n) denotes all of the data samples in the model at a given time index n, the P×1 vector w denotes all the coefficients in the distortion model, and d(n) is the desired output of the model for time instance n.

For any given time index n, both u(n) and d(n) are known, and Equation 12 is a linear equation of w. As noted earlier, for observations obtained on N time indices, the corresponding linear equations expressed in Equation 12 can be compactly expressed as:

$$\underset{N \times P}{U} \cdot \underset{P \times 1}{w} = \underset{N \times 1}{d} \qquad \text{Eq. 13}$$

In Equation 13, U is the input data matrix and d is the desired output vector.

In the indirect-learning architecture of FIG. 1, d(n) is the desired output of the pre-distorter 110, which ideally has a distortion function that compensates for the distortion introduced by power amplifier 120. Thus, d(n) corresponds to z(n), the input to power amplifier 120 when the indirect-learning architecture is used. The input signal to the distortion model, denoted as x(n) in FIGS. 3-7, corresponds to the scaled output of the power amplifier 120, y(n)/G. Thus, for any given model structure, samples of the output from the power amplifier 120 are taken for each of N sampling instances and applied to a set of basis functions to produce a matrix U. This matrix U is fitted to the desired output vector d according to Equation 13, where d is a vector of samples of the input to power amplifier, taken at the same N sampling instances used to form the matrix U.

As discussed earlier, the distortion characteristics for the power amplifier are modeled directly in the direct-learning architecture of FIG. 2. In this case, the "desired" distortion signal d(n) corresponds to the scaled output of power amplifier 120, y(n)/G. The input x(n) to the model corresponds to the input signal of the power amplifier. Thus, for any given model structure, samples of the input from power amplifier 120 are taken for each of N sampling instances and applied to a set of basis functions to produce a matrix U. This matrix U is fitted to the desired output vector d according to Equation 13, where d is a vector of samples of the scaled output from the power amplifier, taken at the same N sampling instances used to form the matrix U.

Regardless of the details of the model structure, and regardless of whether the indirect-learning architecture or the direct-learning architecture is used, at the center of the coefficient evaluation in the digital pre-distorter 110 of FIGS. 1 and 2 is the challenge of estimating the coefficient vector w based on Equation 13 satisfying a certain criterion. In order to solve this estimation challenge, inversion of the data matrix U, or $U^H U$, in some form is used. A well known measure of sensitivity of a matrix to digital operations, such as matrix inversion, is the so-called condition number, which is defined as the ratio of the maximum Eigen value of a matrix to its minimum Eigen value. Matrices with condition numbers near 1 are said to be well-conditioned.

Because matrix computations can be quite complex, a design consideration for a distortion model for a power amplifier or a pre-distorter is to provide the coefficient evaluation algorithm with a data matrix $U^H U$ that has a relatively small number of columns (to reduce the computational complexity of the matrix operations), that has a condition number as close to 1 as possible for high numerical stability, and that at the same time also models the physical behavior of the power amplifier or pre-distorter as exactly as possible, given a particular optimization criteria. One problem associated with adding memory effects to conventional distortion models is the extra instability added to the coefficient evaluation process due to the introduction of the memory model terms in the model. This problem exists for both the direct and indirect learning architectures.

This added instability is reflected in a significant increase, sometimes as much as by a factor of $10^6$, of the condition number of the data matrix that has to be inverted in the parameter evaluation process. This problem can be quite serious in an adaptive digital pre-distortion system with memory, as the parameters in such a system have to be adapted "on the fly" to track the distortion characteristics of the power amplifier over time.

A fundamental source of this added instability is the high correlation among the data samples used in the coefficient evaluations. This is a result of at least two aspects of the digital pre-distorter. First, successive input data samples to the pre-distorter exhibit high correlation with one another due to the significantly over-sampled nature of the input signal to the pre-distorter. This high correlation is a result of the high ratio, at least on the order of 3-5, of the sampling rate to the baseband bandwidth of the input signal. This high over-sampling ratio is due, in turn, to the fact that the pre-distorter is intended, by design, to distort the input signal. This necessarily causes bandwidth expansion. As a result, the signals processed in the pre-distorter system must be sampled at a rate significantly higher than that necessary to capture the information in the original, undistorted signal.

Also, given a tapped delay line structure for the memory model, consecutive input data samples are directly used to create the matrix U that is used for coefficient evaluations. As a result, the data samples used in the coefficient evaluations exhibit high correlation.

Figure 11:
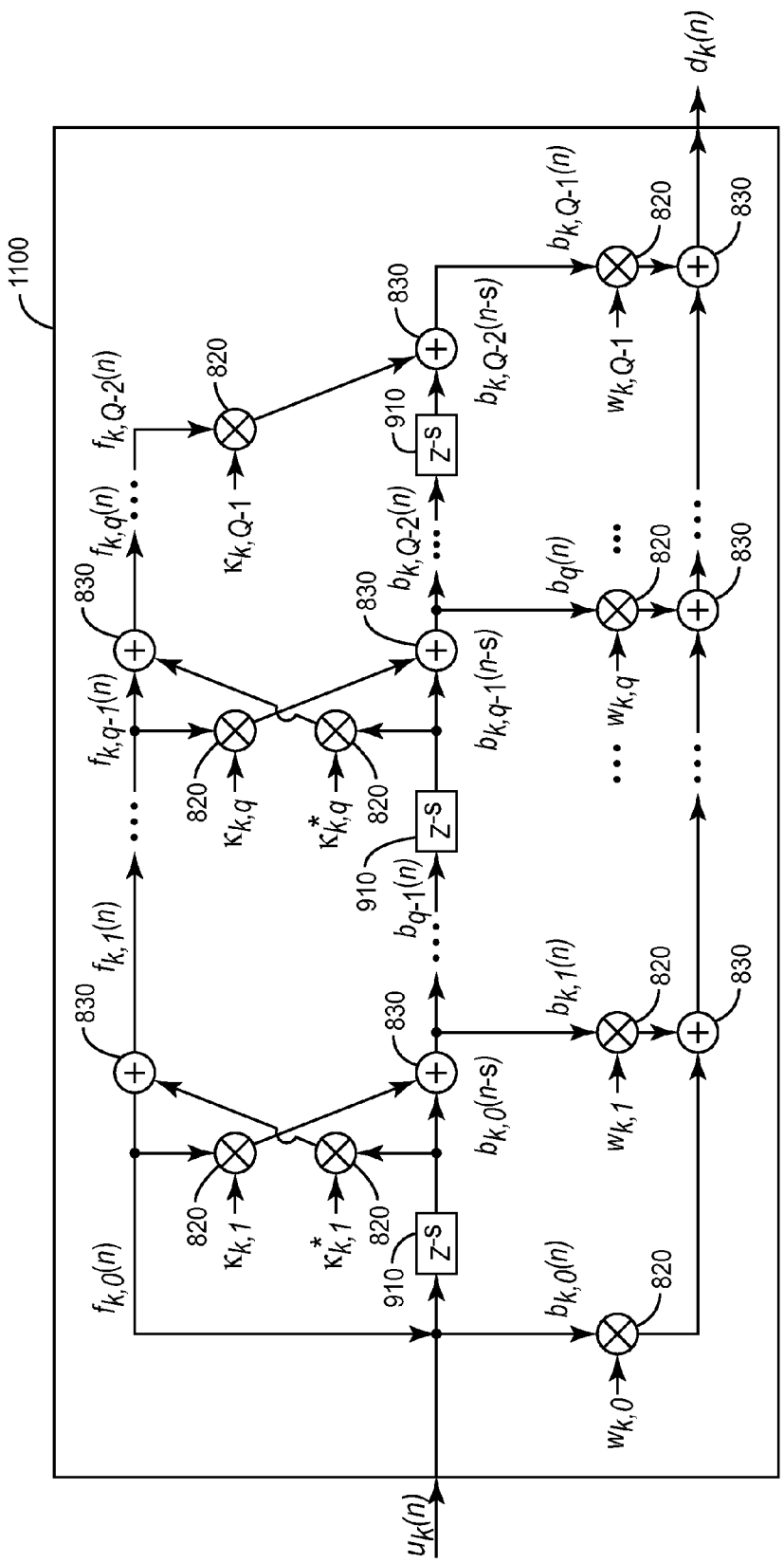
FIG. 11 is a block diagram of an exemplary memory model based on a predictive lattice with non-unit delays constructed in accordance with principles of the present invention.

FIG. 11 illustrates a lattice predictor memory model 1100 that addresses these issues. Lattice predictor memory model 1100 is similar to the model 1000 pictured in FIG. 10, but has non-unit delay elements 910, instead of unit-delay elements. Thus each of the delay elements 910, labeled $Z^{-s}$, delays its input signal by s sampling intervals, where s>1.

The structure depicted in FIG. 11 can be represented by the following algorithm:

1. q=0 (initialization):

$$f_{k,0}(n) = b_{k,0}(n) = u_k(n) \quad \text{Eq. 14}$$

2. q=1, ... Q−2 (first stage to the second-to-last stage):

$$f_{k,q}(n) = f_{k,q-1}(n) + \kappa^*_{k,q} b_{k,q-1}(n-s) \quad \text{Eq. 15}$$

$$b_{k,q}(n) = \kappa_{k,q} f_{k,q-1}(n) + b_{k,q-1}(n-s) \quad \text{Eq. 16}$$

3. q=Q−1 (the last stage; $f_{k,Q-1}(n)$ does not need to be computed):

$$b_{k,Q-1}(n) = \kappa_{k,Q-1} f_{k,Q-2}(n) + b_{k,Q-2}(n-s) \quad \text{Eq. 17}$$

An estimate $\hat{\kappa}_{k,q}$ of the q-th order reflection coefficient can be evaluated based on a typical set of data of length N as:

$$\hat{\kappa}_{k,q} = \frac{2 \sum_{n=m+1}^{N} b_{k,q-1}(n-s) f^*_{k,q-1}(n)}{\sum_{n=m+1}^{N} [|f_{k,q-1}(n)|^2 + |b_{k,q-1}(n-s)|^2]} \quad \text{Eq. 18}$$

Note that in Equation 18, the start value of both summations are again set to n=m+1 to exclude the zero terms based on the assumption that $u_k(n)=0$ for n<0.

The determination of the number of delays between adjacent taps, i.e., the value of s, in the non-unit-delay lattice predictor memory model is based on the trade-off between two factors. First, an increase in the delay between taps, i.e., an increase in s, results in a reduction of the condition number in the data matrix U, due to the decreased correlation between successive data samples in the matrix. This increases the stability of the mathematical computations that are performed to derive the optimal tap weights. Of course, this improvement is subject to diminishing improvements as s becomes larger. Thus, there is a point after which the benefit in terms of condition number reduction is insignificant.

Second, as with the tapped-delay-line structure, an increase in the delay between taps results in degradation of the model's performance, as manifested in terms of normalized mean square error (NMSE) between the model output and the desired signal.

Figure 12:
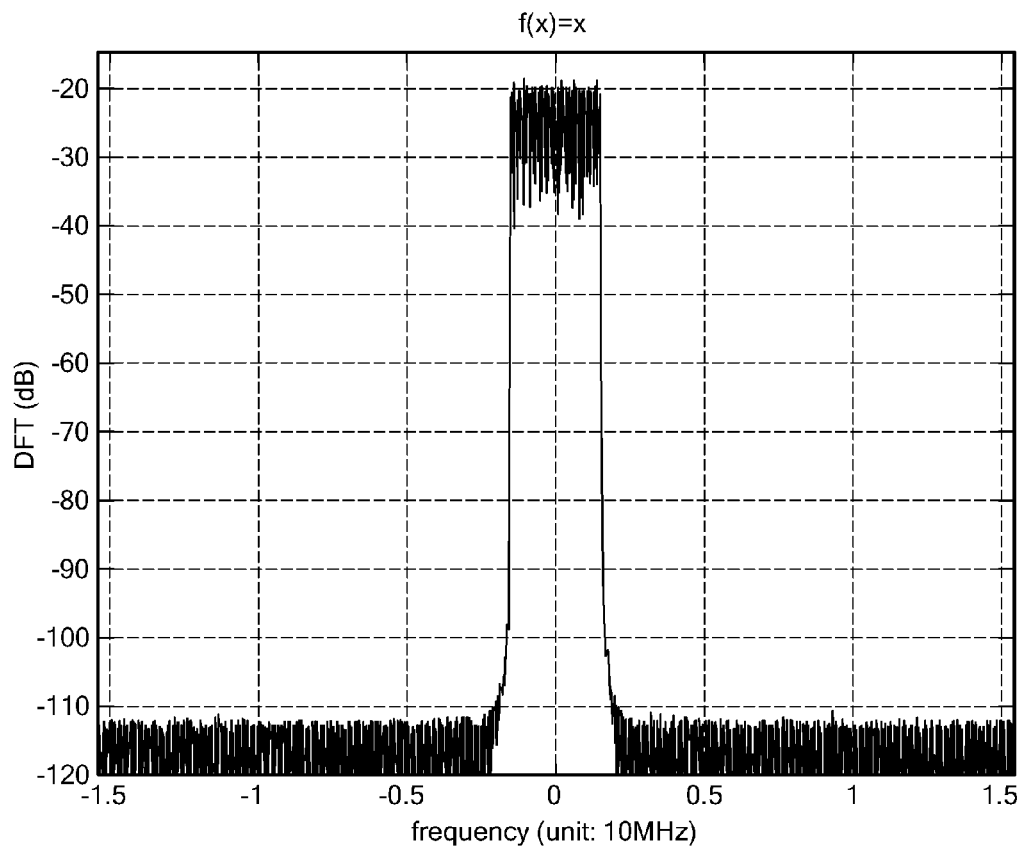
FIG. 12 is a graph of a spectrum of an input signal to which a first order power basis function is applied.

As discussed with respect to FIG. 7, a memoryless part 710 of the non-linear distortion model 700 may consist of power basis functions. FIGS. 12-16 are graphs of frequency spectra of an input signal to which the various power basis functions are applied. Thus, FIG. 12 is a graph of a spectrum of an input signal to which a first order power basis function is applied. In other words the output signal of the first power basis function branch is equal to the input signal. In FIG. 12, a largest integer smaller than the ratio of the sampling rate to the signal bandwidth is 10, which indicates that the signal is greatly over-sampled.

Figure 13:
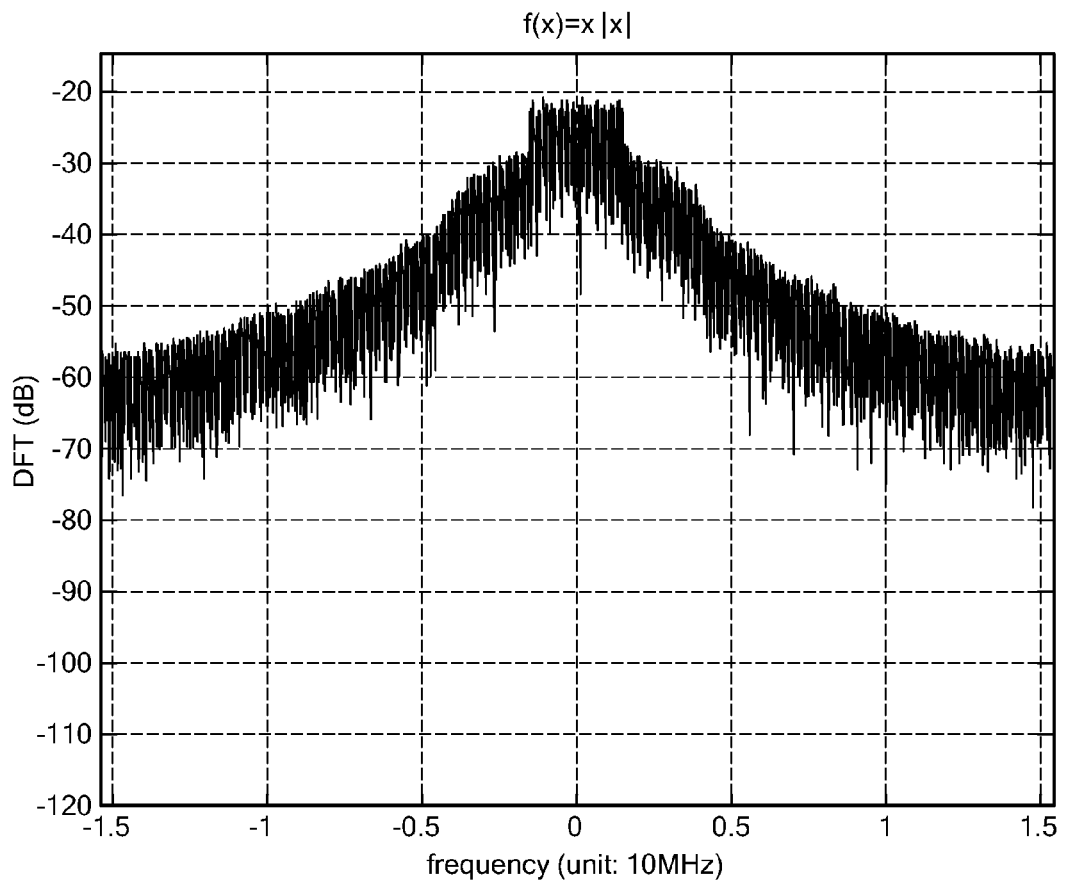
FIG. 13 is a graph of a spectrum of an input signal to which a second order power basis function is applied.
Figure 14:
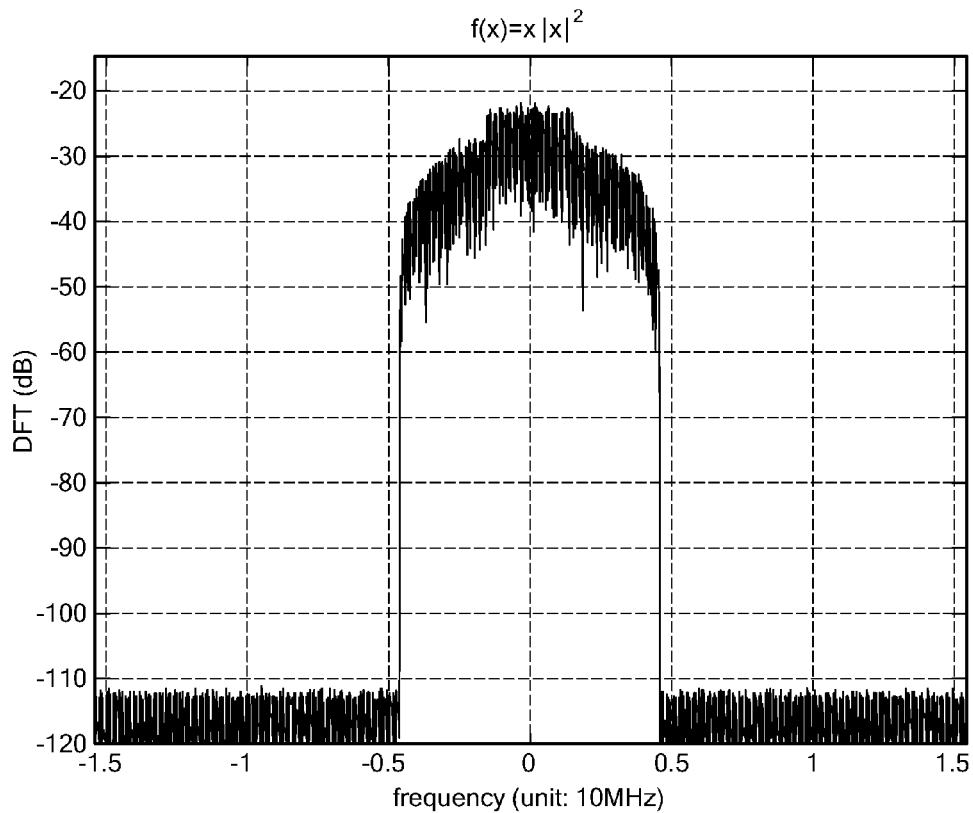
FIG. 14 is a graph of a spectrum of an input signal to which a third order power basis function is applied.
Figure 15:
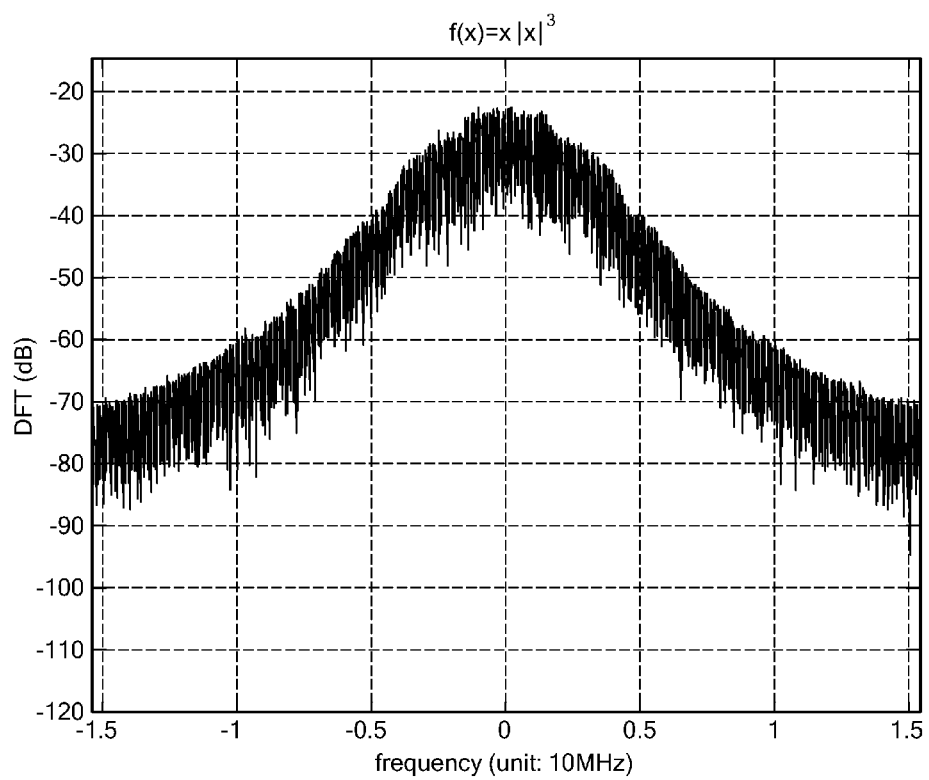
FIG. 15 is a graph of a spectrum of an input signal to which a fourth order power basis function is applied.
Figure 16:
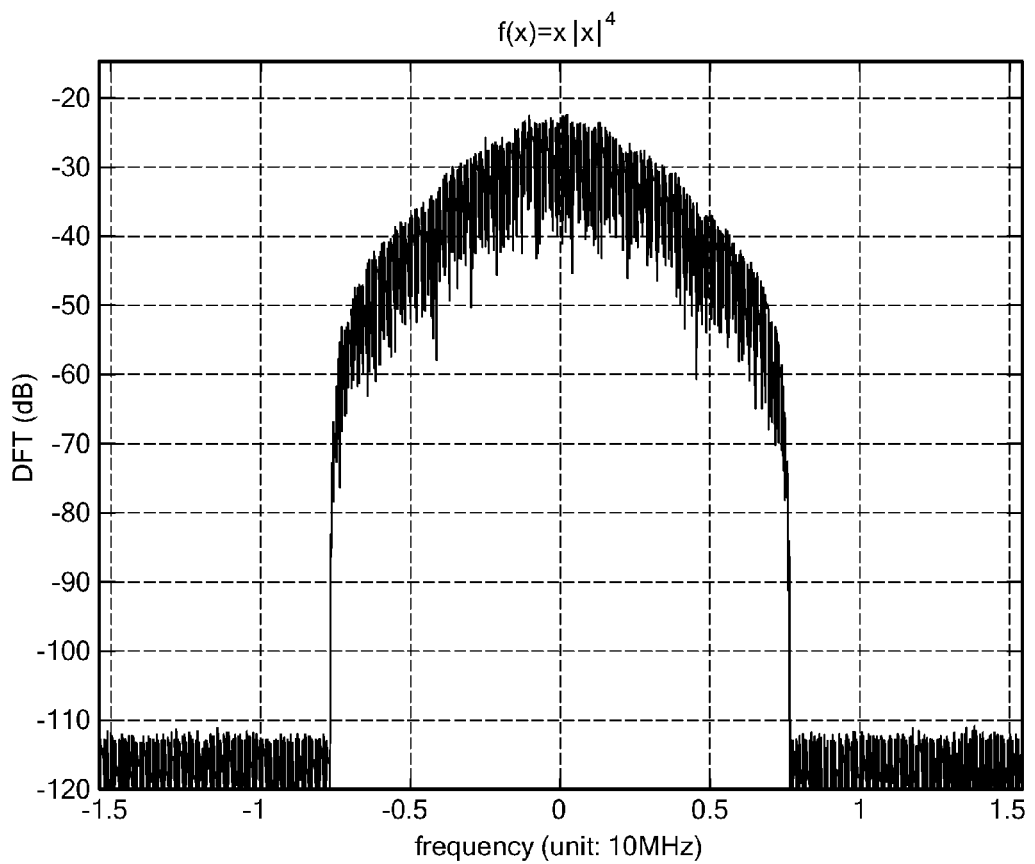
FIG. 16 is a graph of a spectrum of an input signal to which a fifth order power basis function is applied.

FIG. 13 is a graph of a spectrum of an input signal to which a second order power basis function is applied. Note that the bandwidth of the output signal is much larger than the input signal. Thus, the largest integer smaller than the ratio of the sampling rate to the signal bandwidth is 1. FIG. 14 is a graph of a spectrum of an input signal to which a third order power basis function is applied. In FIG. 14, a largest integer smaller than the ratio of the sampling rate to the signal bandwidth is 3, which indicates that the signal is slightly over-sampled. FIG. 15 is a graph of a spectrum of an input signal to which a fourth order power basis function is applied. FIG. 16 is a graph of a spectrum of an input signal to which a fifth order power basis function is applied. In FIG. 16, the largest integer smaller than the ratio of the sampling rate to the signal bandwidth is 2. Note further, that although only the first five power basis functions are illustrated herein, it is not uncommon to model power basis functions of $11^{th}$ order or higher. Further, over-sampling factors may exceed 40 in some systems.

Figure 17:
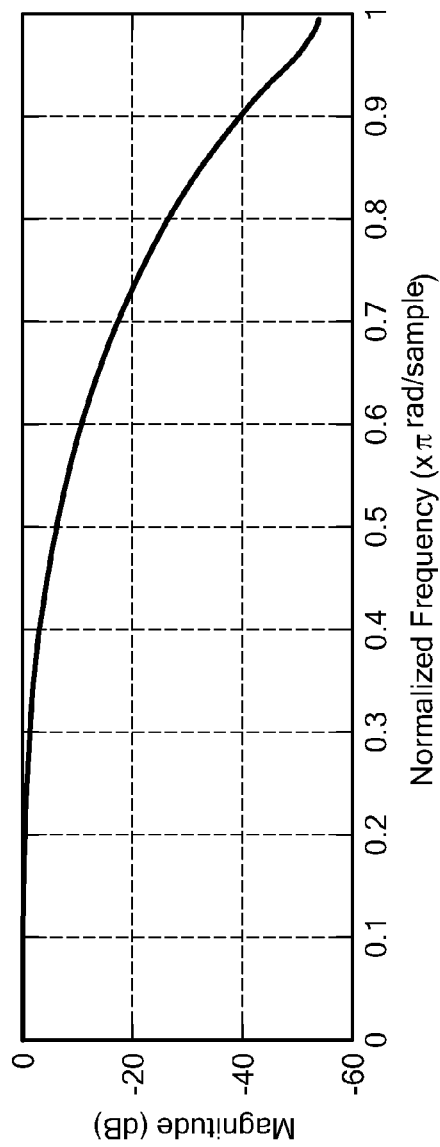
FIG. 17 is a graph of a filter response having one unit delay between taps.
Figure 18:
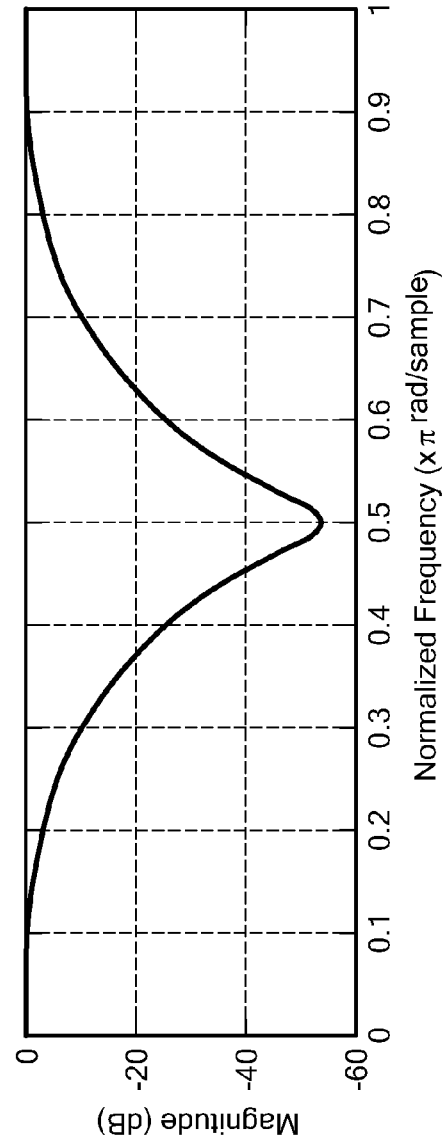
FIG. 18 is a graph of a filter response having two unit delays between taps.
Figure 19:
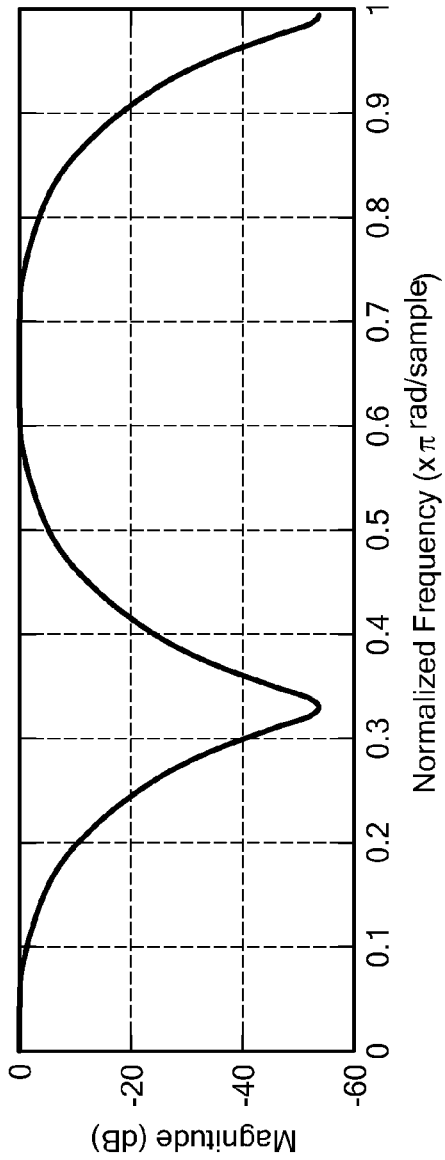
FIG. 19 is a graph of a filter response having three unit delays between taps.
Figure 20:
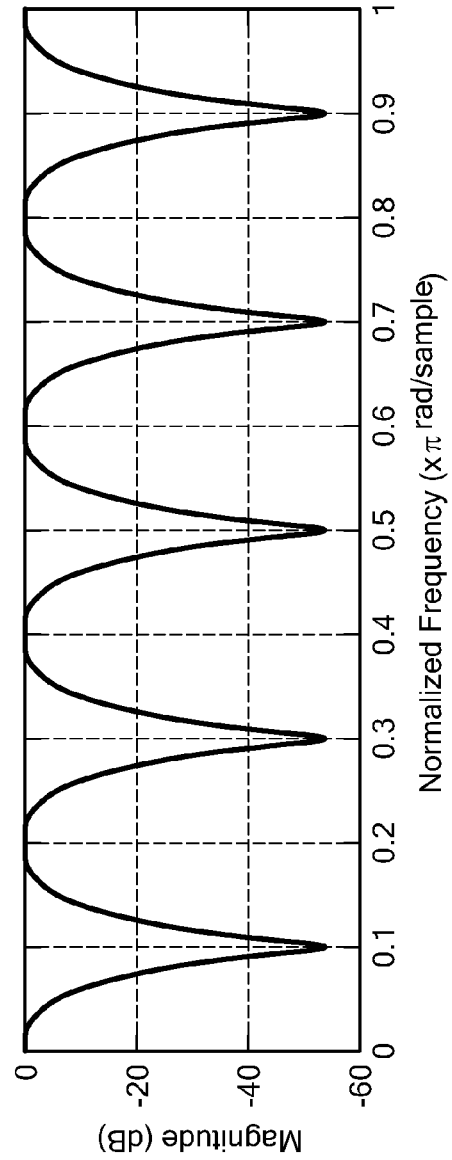
FIG. 20 is a graph of a filter response having ten unit delays between taps.

It is well known that the response of a finite impulse response (FIR) filter with non-unitary delays between taps is equivalent to the up-sampled response of an FIR filter with the same coefficient for each tap but with a unit delay between taps. The up-sampling factor equals the number of non-unit delays between taps. FIGS. 17-20 show the frequency characteristics of a 6 tap filter having varying units of delay between taps. Thus, FIG. 17 shows a six-tap filter response with a unit delay between adjacent taps, FIG. 18 shows a six-tap filter response with two unit delays between adjacent taps, FIG. 19 shows a six-tap filter response with three unit delays between taps, and FIG. 20 shows a six-tap filter response with ten unit delays between taps.

The output of a branch of a memory part 720 of the memory structure 700 is the convolution of the branch input and the system impulse response. In the frequency domain, this is equivalent to the point-for-point multiplication of the frequency spectrum of the input signal and the frequency spectrum of the filter response. Comparing FIGS. 12 and 20, a minimum of 10 unit delays between adjacent taps enables the characterization of the memory effect of a first order power basis function without sacrificing performance. Comparing FIGS. 14 and 19, a minimum of 3 unit delays between adjacent taps enables the characterization of the memory effect of the third order power basis function without sacrificing performance. Similarly, comparing FIGS. 16 and 18, a minimum of 2 unit delays between adjacent taps enables characterization of the memory effect of the fifth order power basis function.

Therefore, it can be seen that each branch of the memory part 720 of the non-linear distortion model 700 has a number of unit delays between taps that is selected based on the order of the basis function for which compensation is to be achieved. The minimum number of delays between adjacent taps in a branch may be chosen to be the maximum integer smaller than the ratio of the sampling rate to the bandwidth of the input to the branch of the memory part 720 of the model 700. By optimizing the number of unit delays between taps in each branch, unnecessary computations are avoided, resulting in reduction in cost and improvement in efficiency and stability of the pre-distorter.

Thus, one embodiment of a pre-distorter memory model has a plurality of branches with a different number of delays between taps in at least two of the branches. For example, referring to FIG. 9, each branch represented by the configuration 900 may implement a different value of the delay, s, between adjacent taps. Similarly, referring to FIG. 11, each branch represented by the configuration 1100 may implement a different value of the delay, s, between adjacent taps. Thus, each branch of memory part 720 may implement a different delay between adjacent taps. The delay, s, may be based on a characteristic of the output basis function signal received from a branch of the memoryless part 710. For example, the delay may be based on a ratio of a sampling frequency to a bandwidth of the output basis function signal received by the memoryless part of the branch. Each branch may have a plurality of multipliers where each multiplier receives an output of a different delay element in the branch. The multiplier multiplies the output of a delay element by a coefficient. The outputs of the multipliers are added to produce a distortion signal component for the branch. The distortion signal components output by each branch are added to produce the distortion signal being modeled by the pre-distorter model.

Figure 21:
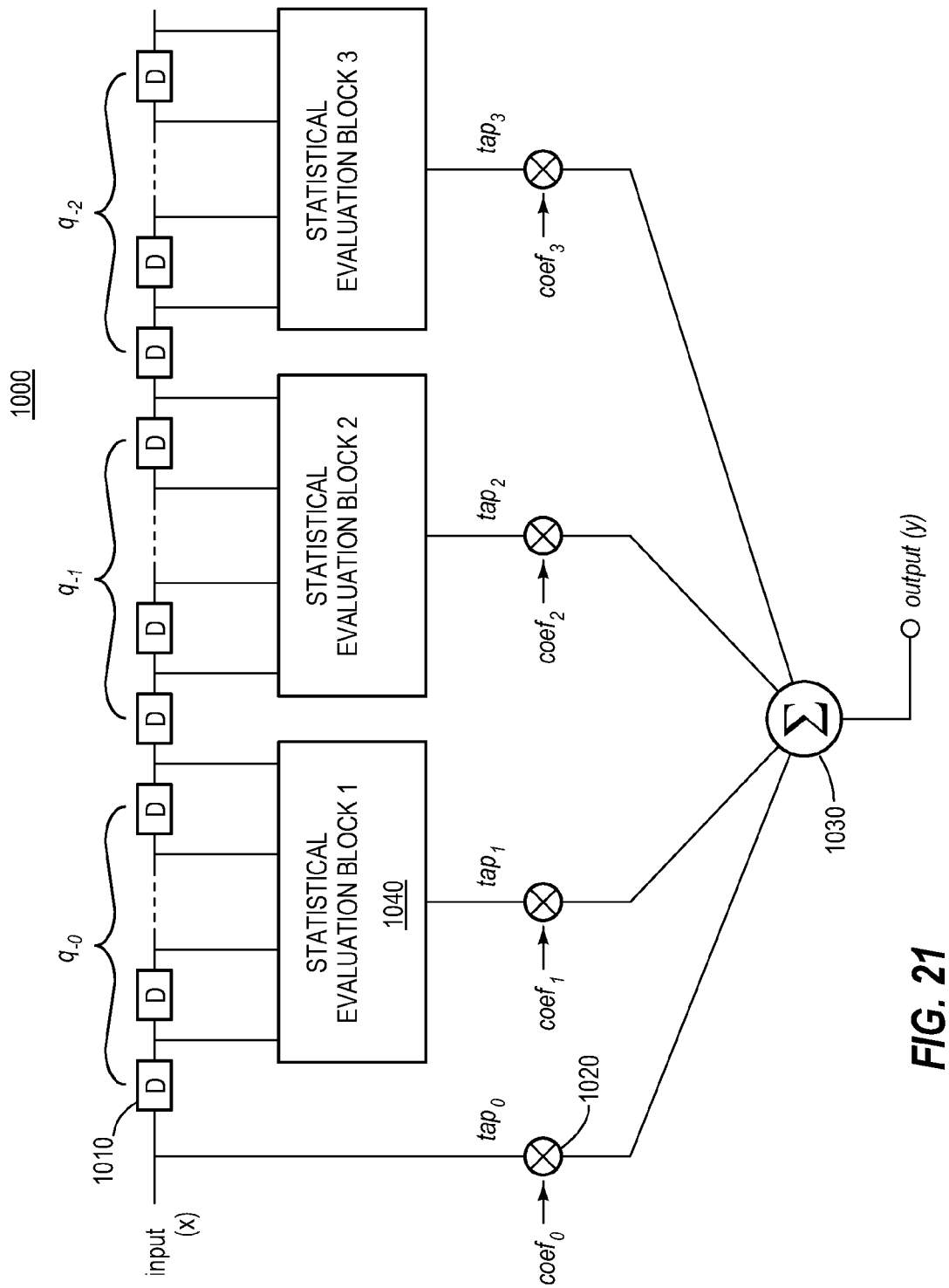
FIG. 21 is a block diagram of an exemplary statistical evaluation based memory structure constructed in accordance with the principles of the present invention.

FIG. 21 is a block diagram of an exemplary statistical evaluation based memory structure 1000, having unit delays 1010, coefficient multipliers 1020, an adder 1030, and statistical evaluation blocks 1040. Statistical evaluation blocks 1040 may perform statistical calculations based on the input samples received from taps between adjacent delays. The number of taps fed to a statistical evaluation 1040 block may be based on a time duration of a memory effect to be modeled. For example, modeling memory effects of seconds would require more taps than modeling memory effects of milliseconds.

Figure 22:
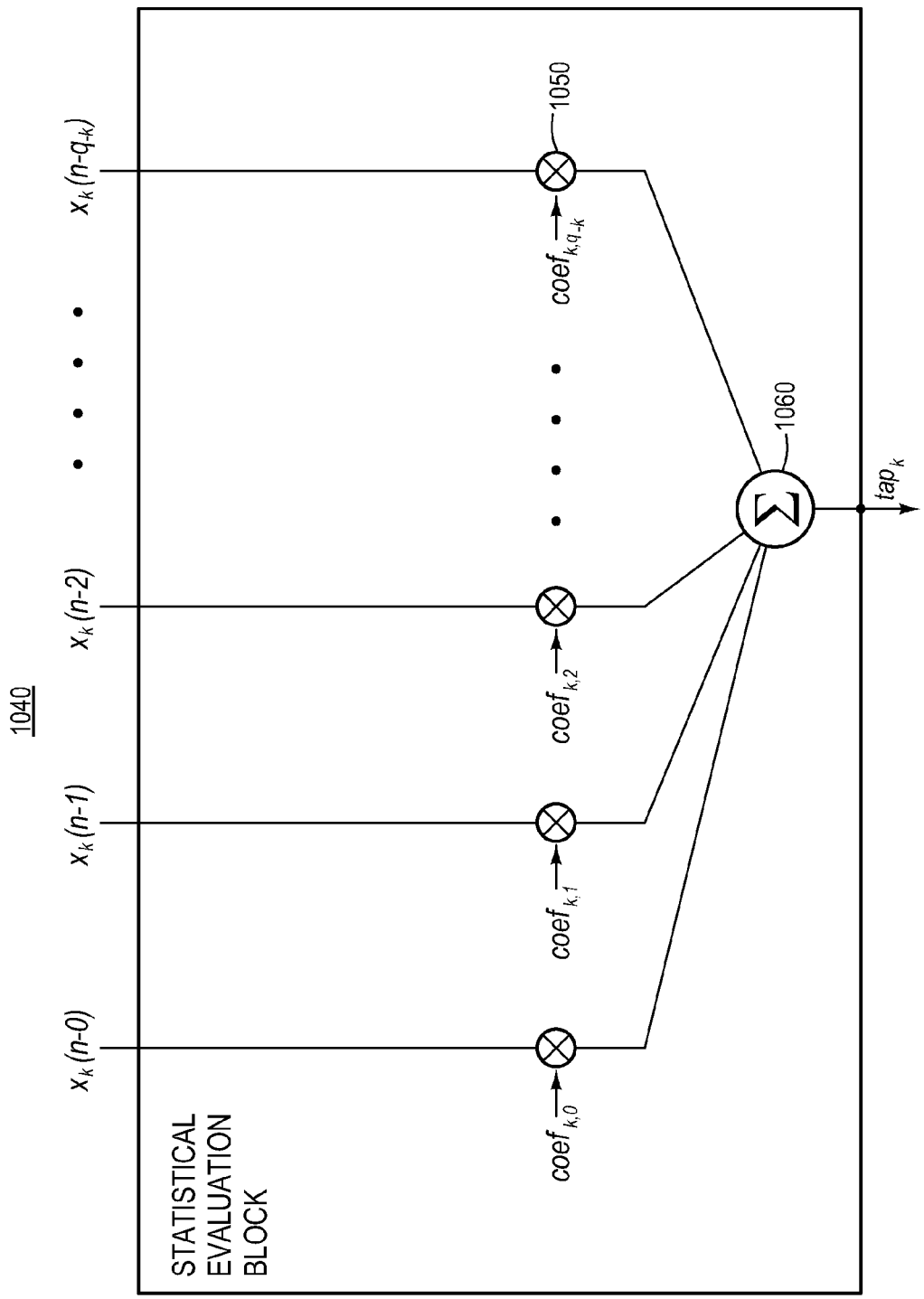
FIG. 22 is a block diagram of an exemplary first statistical evaluation block constructed in accordance with the principles of the present invention.
Figure 23:
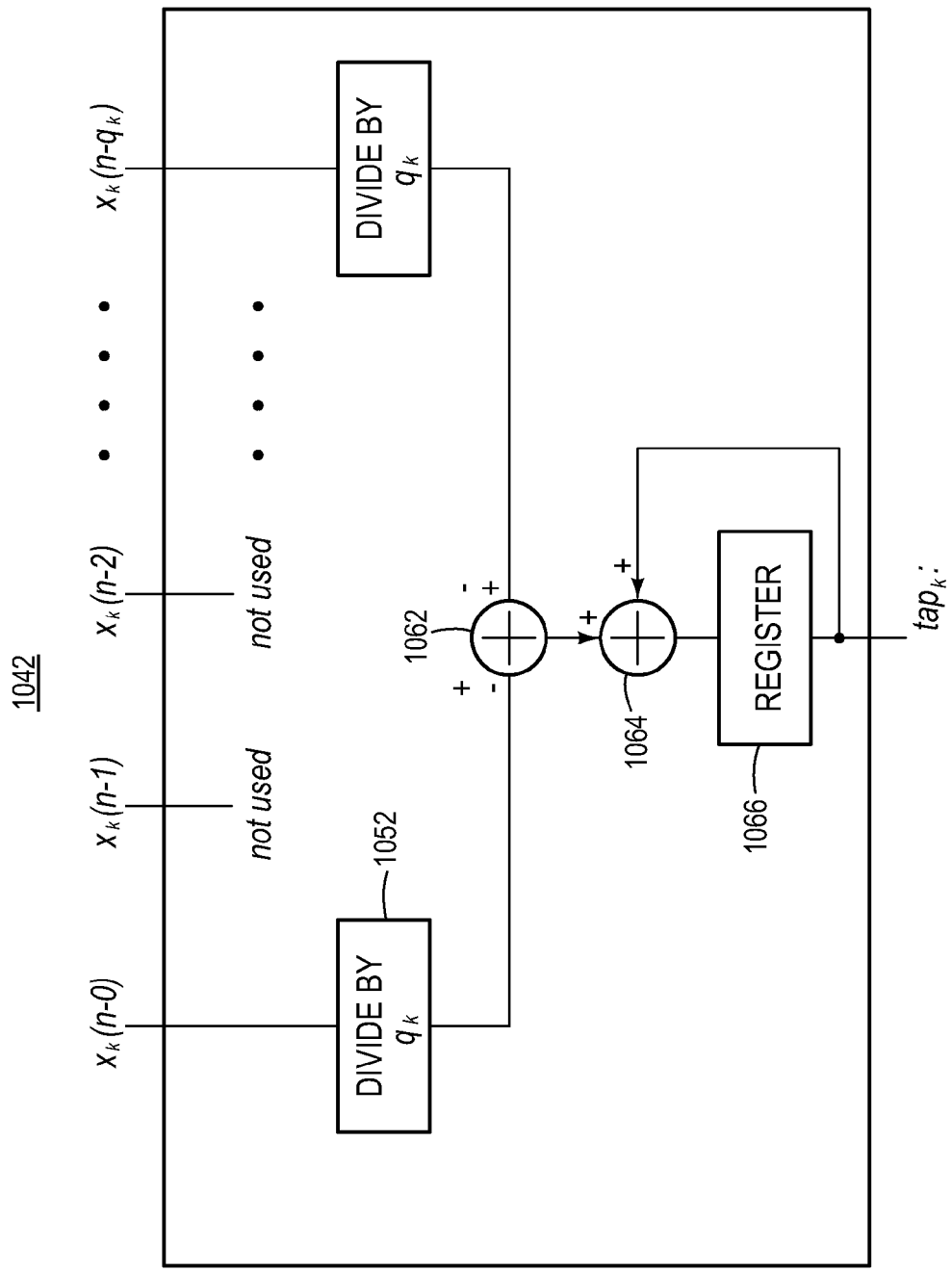
FIG. 23 is a block diagram of an exemplary second statistical evaluation block constructed in accordance with the principles of the present invention.

A statistical evaluation block 1040 may compute a weighted average of samples from the delay lines, as shown in FIG. 22, employing multipliers 1050 and adder 1060. FIG. 23 shows a simple averaging of samples separated by a plurality of delays. The number of delays between averaged samples may be selected based on a power basis function for which the branch is designed to filter, as discussed above.

In FIG. 23, a first sample and a last sample are divided by the number of taps, $q_k$, the results are summed in the adder 1062. Adder 1064 and register 1066 form a moving average of the output of the adder 1062. Note that if $q_k$ is chosen as a power of two, then division by $q_k$ is equivalent to dropping a number of least significant bits from the number being divided.

Thus, a pre-distorter model may include at least one statistical evaluation block in at least one branch of a memory part 720. The statistical evaluation block receives at least one output of a series of delay elements. In one embodiment, the statistical evaluation block receives outputs of a plurality of sequential delay elements and multiplies each received output by a respective coefficient. In another embodiment, a statistical evaluation block in a branch receives an output of a first delay element and an output of a second delay element, where at least one intervening delay element between the first and second delay element does not contribute an output to the statistical evaluation block. In such an embodiment, the first and second delay element outputs may be averaged by the statistical evaluation block. Each one of multiple different statistical evaluation blocks in a branch may receive outputs from a different number of delay elements.

One embodiment is a method for generating a distortion signal d(n) derived from an input signal x(n). The input signal x(n) is supplied to each of K branches. In each branch, the input signal is operated on by a different basis function to produce an output of the branch, $u_k(n)$. Each output signal $u_k(n)$ is input to a different one of K memory models. Each memory model includes at least one delay element that delays the signal $u_k(n)$ by a pre-determined delay that is different for each of at least two branches. The output of each of the at least one delay element is multiplied by a coefficient, and the outputs of the multipliers are added to produce a distortion signal component $d_k(n)$ of the branch. The distortion signal components $d_k(n)$ from the various branches are added to produce the distortion signal d(n)

The present invention can be realized in hardware, or a combination of hardware and software. Thus, for example, the memory models of FIGS. 8-11 can be implemented as hardware elements, can be implemented in software, or in a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A pre-distorter memory modeling apparatus, comprising:

a plurality of branches, each branch receiving a different output basis function signal, each branch including at least one delay element having a corresponding output, each delay element causing a pre-determined delay of the output basis function signal received by the branch, the amount of a pre-determined delay being different for each of at least two branches receiving a different basis function signal.

2. The apparatus of claim 1, wherein the pre-determined delay of the at least one delay element of a branch of the plurality of branches is based at least in part on an order of the output basis function signal received by the branch.

3. The apparatus of claim 1, wherein the pre-determined delay of the at least one delay element of a branch of the plurality of branches is based at least in part on a ratio of a sampling frequency to a bandwidth of the output basis function signal received by the branch.

4. The apparatus of claim 1, wherein an output basis function signal includes magnitudes of samples of an input signal raised to a power.

5. The apparatus of claim 1, further comprising:
a plurality of multipliers in each of a plurality of the branches, each multiplier in a branch receiving an output of a different delay element, each multiplier multiplying the output of a delay element by a corresponding coefficient.

6. The apparatus of claim 1, further comprising:
at least one statistical evaluation block in each of at least one branch of the plurality of branches, the at least one statistical evaluation block receiving an output of at least one delay element.

7. The apparatus of claim 6, wherein the at least one statistical evaluation block receives outputs of a plurality of sequential delay elements.

8. The apparatus of claim 7, wherein the at least one statistical evaluation block that receives outputs of a plurality of sequential delay element multiplies each received output of the plurality of sequential delay elements by a respective coefficient.

9. The apparatus of claim 6, wherein a branch includes a first delay element, a second delay element and at least one intervening delay element, and the at least one statistical evaluation block receives an output of the first delay element and an output of the second delay element, and the at least one intervening delay element being located between the first delay element and the second delay element that does not provide an output to the at least one statistical evaluation block.

10. The apparatus of claim 9, wherein the outputs of the first delay element and the second delay element are averaged by the at least one statistical evaluation block that receives the outputs of the first and second delay elements.

11. The apparatus of claim 6, further comprising:
at least one multiplier receiving an output of a statistical evaluation block, the at least one multiplier multiplying the output of the statistical evaluation block by a corresponding coefficient.

12. A method for generating a distortion signal, d(n), comprising:
receiving an input signal, x(n);
supplying the input signal, x(n), to each of K branches where K is an integer not less than 1;
in each of the K branches, operating on the input signal, x(n), by a different basis function to produce K output signals, $u_k(n)$, where k=0 to K−1;
in each of the K branches, applying one of the K output signals, $u_k(n)$, to a different one of K memory models, each of the K memory models having:
a plurality of sequential delay elements delaying the signal, $u_k(n)$, by a total pre-determined delay that is different for each of at least two branches receiving a different basis function;
for each delay element, a multiplier to multiply an output of a delay element by a coefficient, $w_{k,q}$;
an adder to add each output of a multiplier to produce a distortion signal component $d_k(n)$ output from the branch; and
adding the distortion signal components, $d_k(n)$, from each of the K memory models to produce the distortion signal, d(n).

13. The method of claim 12, wherein operation on the input signal, x(n), by a basis function includes raising the input signal, x(n), by an integer power.

14. The method of claim 12, wherein an amount of the pre-determined delay of a delay element of a branch is based at least in part on a sampling frequency and a bandwidth of the signal, $u_k(n)$, applied to the branch.

15. A pre-distorter memory model branch apparatus, comprising:
a plurality of sequential delay elements, each delay element delaying a received signal, $u_k(n)$, by a predetermined amount of delay;
a plurality of statistical evaluation blocks, each statistical evaluation block:
receiving a plurality of outputs from a plurality of the delay elements, a number of the plurality of sequential delay elements from which outputs are received by a statistical evaluation block being based on a time duration of a memory effect to be modeled by the statistical evaluation block, so that each of a plurality of the statistical evaluation blocks models a memory effect of a different time duration,
applying a weight to at least one of the plurality of outputs from the plurality of delay elements to produce at least one weighted signal;
combining the at least one weighted signal from each of the plurality of statistical evaluation blocks, to produce an output, $d_k(n)$.

16. The apparatus of claim 15, wherein the predetermined amount of delay is based at least in part on a sampling frequency and a bandwidth of the received signal, $u_k(n)$.

17. The apparatus of claim 15, wherein the at least one statistical evaluation block includes a plurality of multipliers, each multiplier multiplying an output of a different one of the plurality of sequential delay elements.

18. The apparatus of claim 15, wherein outputs of a plurality of statistical evaluation blocks are each multiplied by a coefficient and summed to produce the output, $d_k(n)$.

19. The apparatus of claim 18, wherein each statistical block receives outputs of a different number of the sequential delay elements.

20. The apparatus of claim 15, wherein a statistical evaluation block comprises a first multiplier to multiply an output of a first delay element by a first coefficient and a second multiplier to multiply an output of a second delay element by a second coefficient, wherein at least a third delay element is interposed between the first delay element and the second delay element, an output of the third element being not used by the statistical evaluation block.

* * * * *